US012757725B2

(12) United States Patent
Lin

(10) Patent No.: US 12,757,725 B2
(45) **Date of Patent: *Oct. 6, 2026**

(54) SEMICONDUCTOR DEVICE WITH COMPOSITE DIELECTRIC AND METHOD FOR FABRICATING THE SAME

(71) Applicant: NANYA TECHNOLOGY CORPORATION, New Taipei City (TW)

(72) Inventor: Yuan-Yuan Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 351 days.

This patent is subject to a terminal disclaimer.

(21) Appl. No.: 18/612,042

(22) Filed: Mar. 21, 2024

(65) Prior Publication Data

US 2025/0300083 A1 Sep. 25, 2025

(51) Int. Cl.

*H10W 20/47* (2026.01)
*H10P 14/60* (2026.01)
*H10W 20/41* (2026.01)

(52) U.S. Cl.

CPC ......... *H10W 20/47* (2026.01); *H10P 14/6319* (2026.01); *H10W 20/425* (2026.01); *H10W 20/435* (2026.01)

(58) Field of Classification Search

CPC ...... H10P 14/60; H10P 14/6319; H10P 50/00; H10P 50/71; H10P 95/00; H10W 20/00;

(Continued)

(56) References Cited

U.S. PATENT DOCUMENTS

2003/0218253 A1* 11/2003 Avanzino .............. H10P 14/683 438/622
2004/0061236 A1 4/2004 Koide (Continued)

FOREIGN PATENT DOCUMENTS

TW 202114062 A 4/2021
TW 202226394 A 7/2022

(Continued)

OTHER PUBLICATIONS

Office Action and and the search report mailed on Jul. 4, 2025 related to Taiwanese Application No. 114105165.

(Continued)

*Primary Examiner* — Brook Kebede
(74) *Attorney, Agent, or Firm* — Xuan Zhang

(57) ABSTRACT

The present application discloses a semiconductor device and a method for fabricating the semiconductor device. The semiconductor device includes a first interconnect structure disposed in a semiconductor substrate, first and second dielectric layers disposed over the semiconductor substrate, a second interconnect structure disposed in the first and second dielectric layers, and a third interconnect structure disposed in the semiconductor substrate. The first interconnect structure includes a first conductive line and a first manganese-containing layer. The second interconnect structure includes a second conductive line and a second manganese-containing layer. The third interconnect structure includes a third conductive line and a third manganese-containing layer. The third manganese-containing layer of the third interconnect structure and the first manganese-containing layer of the first interconnect structure are made of a same material.

17 Claims, 30 Drawing Sheets

(58) Field of Classification Search
CPC ........... H10W 20/0552; H10W 20/063; H10W 20/0633; H10W 20/072; H10W 20/074; H10W 20/095; H10W 20/097; H10W 20/40; H10W 20/41; H10W 20/425; H10W 20/435; H10W 20/46; H10W 20/47; H10W 20/48; H10W 20/496
See application file for complete search history.

(56) References Cited

U.S. PATENT DOCUMENTS

| | | | | |
|---|---|---|---|---|
| 2008/0318430 A1* | 12/2008 | Park | H10P 14/6548 | 257/E21.214 |
| 2010/0320604 A1 | 12/2010 | Isobayashi | | |
| 2012/0025395 A1* | 2/2012 | Chikaki | H10W 20/47 | 257/774 |
| 2013/0334700 A1* | 12/2013 | Singh | H10W 20/084 | 257/E21.586 |
| 2015/0171007 A1* | 6/2015 | Huang | H10W 20/42 | 257/774 |
| 2022/0223535 A1* | 7/2022 | Huang | H10W 20/425 | |

FOREIGN PATENT DOCUMENTS

| | | |
|---|---|---|
| TW | 202228261 A | 7/2022 |
| TW | I261334 B | 5/2024 |

OTHER PUBLICATIONS

Summary translation of Office Action and and the search report mailed on Jul. 4, 2025 related to Taiwanese Application No. 114105165.
Office Action and and the search report mailed on Feb. 26, 2025 related to Taiwanese Application No. 113117618.
Summary translation of Office Action and and the search report mailed on Feb. 26, 2025 related to Taiwanese Application No. 113117618.

* cited by examiner

10

SEMICONDUCTOR DEVICE WITH COMPOSITE DIELECTRIC AND METHOD FOR FABRICATING THE SAME

TECHNICAL FIELD

The present disclosure relates to a semiconductor device and a method for fabricating the semiconductor device, and more particularly, to a semiconductor device with a composite dielectric layer and a method for fabricating the semiconductor device with the composite dielectric layer.

DISCUSSION OF THE BACKGROUND

Semiconductor devices are used in various electronic applications, including personal computers, cellular telephones, digital cameras, and other electronic equipment. The size of semiconductor devices is continuously decreasing to meet the growing demand for computing power. However, scaling down presents challenges that are becoming more frequent and impactful. Therefore, there are still challenges to overcome in improving quality, yield, performance and reliability while reducing complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first interconnect structure disposed in a semiconductor substrate; a first dielectric layer disposed over the semiconductor substrate; a second dielectric layer disposed over the first dielectric layer; a second interconnect structure disposed in the first dielectric layer and the second dielectric layer, and electrically connected to the first interconnect structure; and a third interconnect structure disposed in the semiconductor substrate. The first interconnect structure comprises a first conductive line and a first manganese-containing layer disposed over the first conductive line. The second interconnect structure comprises a second conductive line and a second manganese-containing layer disposed between the second conductive line and the first dielectric layer and between the second conductive line and the second dielectric layer. The third interconnect structure comprises a third conductive line and a third manganese-containing layer disposed over the third conductive line. The third manganese-containing layer of the third interconnect structure and the first manganese-containing layer of the first interconnect structure are made of a same material. The first interconnect structure and the second interconnect structure are disposed in a pattern-sparse region and the third interconnect structure is disposed in a pattern-dense region.

Another aspect of the present disclosure provides a semiconductor device including a capacitor contact disposed over a semiconductor substrate; a first dielectric layer disposed over the capacitor contact; a patterned mask disposed over the first dielectric layer; and a bottom capacitor electrode disposed over and electrically connected to the capacitor contact. The bottom capacitor electrode comprises a base layer disposed between the capacitor contact and the first dielectric layer; a surrounding portion disposed over the base layer and along sidewalls of the first dielectric layer and the patterned mask; and a first interconnect portion disposed between the patterned mask and the base layer. The first interconnect portion is substantially parallel to the base layer. The patterned mask is surrounded by the surrounding portion. Sidewalls of the patterned mask are substantially aligned with the sidewalls of the first dielectric layer.

Another aspect of the present disclosure provides a semiconductor device including a first interconnect structure disposed in a semiconductor substrate; a second interconnect structure disposed over the first interconnect structure and electrically connected to the first interconnect structure, wherein the second interconnect structure comprises a first part disposed on the first interconnect structure and a second part disposed on the first part; a first dielectric layer disposed over the semiconductor substrate and surrounding the first part of the second interconnect structure; a top barrier layer disposed between the second part of the second interconnect structure and the first dielectric layer; and a second dielectric layer disposed above the first dielectric layer, covering the top barrier layer and surrounding the second part of the second interconnect structure.

Due to the design of the semiconductor device of the present disclosure, a parasitic capacitance of the semiconductor device can be reduced by adopting dielectric layers having a lower dielectric constant. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
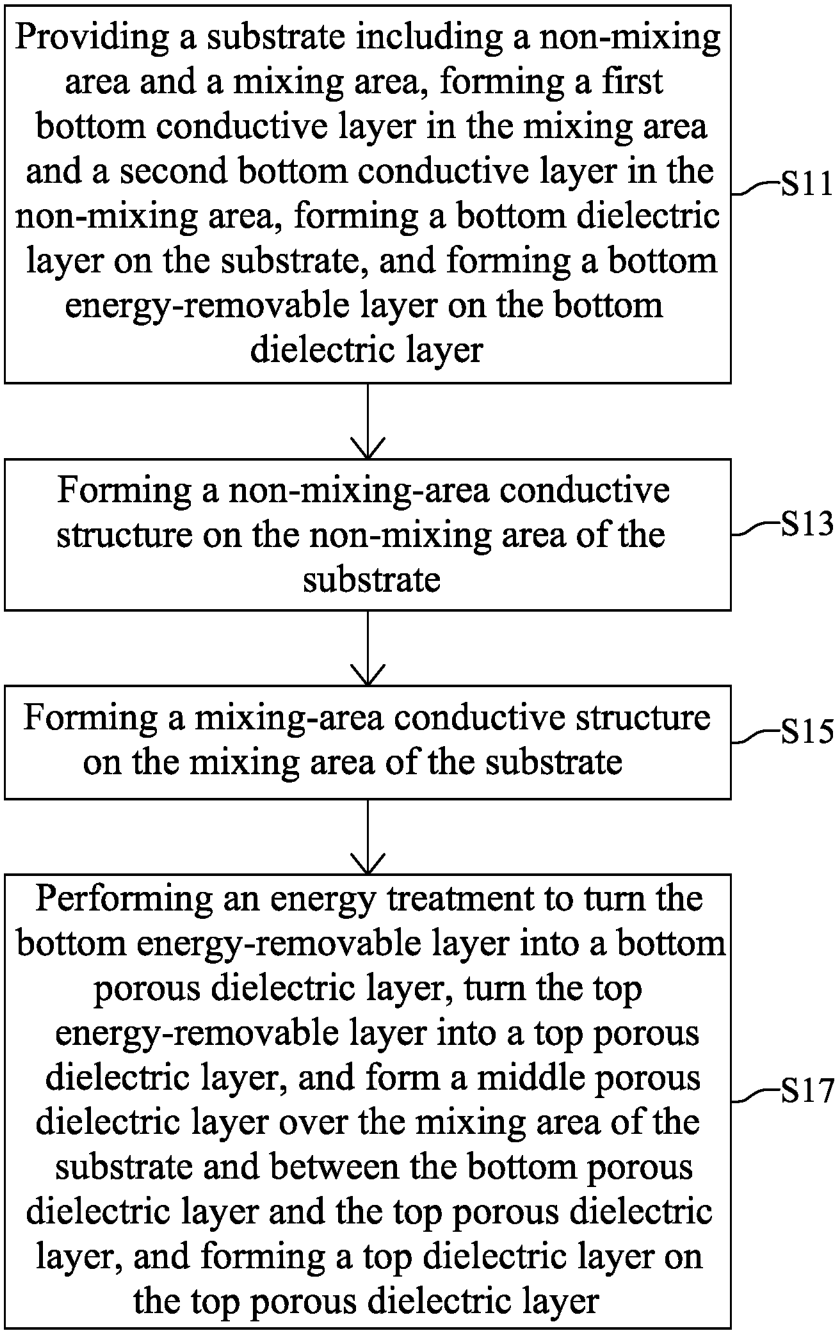
FIG. 1 illustrates, in flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," used herein when referring to orientation, layout, location, shapes, sizes, amounts, or other measures, do not necessarily mean an exactly identical orientation, layout, location, shape, size, amount, or other measure, but are intended to encompass nearly identical orientations, layouts, locations, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device that can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order shown in the figures. For example, two figures shown in succession may in fact be executed substantially concurrently or may sometimes be executed in a reversed order, depending upon the functionalities or steps involved.

FIG. 1 illustrates, in flowchart diagram form, a method 10 for fabricating a semiconductor device 1A in accordance with one embodiment of the present disclosure. FIGS. 2 to 23 illustrate, in schematic cross-sectional view diagrams, a flow for fabricating the semiconductor device 1A in accordance with one embodiment of the present disclosure.

With reference to FIGS. 1 to 4, in step S11, a substrate 101 including a non-mixing area NMA and a mixing area MA may be provided, a first bottom conductive layer 103 may be formed in the mixing area MA and a second bottom conductive layer 105 may be formed in the non-mixing area NMA, a bottom dielectric layer 107 may be formed on the substrate 101, and a bottom energy-removable layer 401 may be formed on the bottom dielectric layer 107.

Figure 2:
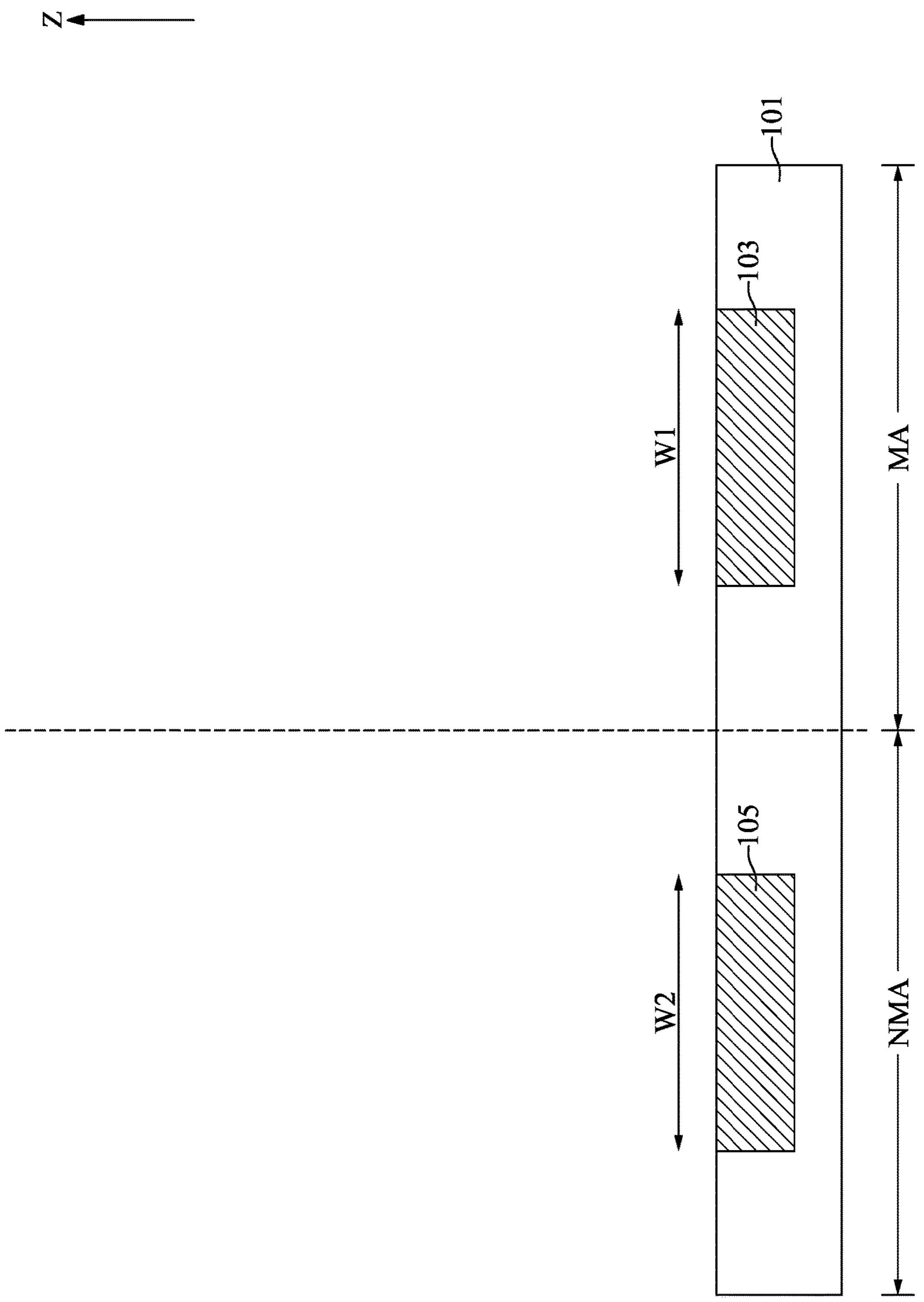
FIGS. 2 to 23 illustrate, in schematic cross-sectional view diagrams, a flow for fabricating the semiconductor device in accordance with one embodiment of the present disclosure.

With reference to FIG. 2, in some embodiments, the mixing area MA and the non-mixing area NMA may be separated from each other. In some embodiments, the mixing area MA and the non-mixing area NMA may be formed adjacent to each other.

It should be noted that the mixing area MA may include a portion of the substrate 101 and a space above the portion of the substrate 101. Describing an element as being disposed on the mixing area MA means that the element is disposed on a top surface of the portion of the substrate 101. Describing an element as being disposed in the mixing area MA means that the element is disposed in the portion of the substrate 101; however, a top surface of the element may be level with the top surface of the portion of the substrate 101. Describing an element as being disposed above (or over) the mixing area MA means that the element is disposed above (or over) the top surface of the portion of the substrate 101. Accordingly, the non-mixing area NMA may comprise another portion of the substrate 101 and a space above the other portion of the substrate 101.

With reference to FIG. 2, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or a combination thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the aforementioned bulk semiconductor substrate. The insulator layer may be a crystalline or non-crystalline dielectric material such as an oxide and/or a nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and either silicon nitride or boron nitride. The insulator layer may have a thickness between about 10 nm and 200 nm.

It should be noted that, in the description of the present disclosure, the term "about," when used to modify the quantity of an ingredient, component, or reactant of the present disclosure, refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or to carry out the methods, and the like. In one aspect, the term "about" means within 10% of the reported numerical value. In another aspect, the term "about" means within 5% of the reported numerical value. In yet another aspect, the term "about" means within 10%, 9%, 8%, 7%, 6%, 5%, 4%, 3%, 2% or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, connect device elements to an adjacent interconnect layer, and/or connect conductive pads to an adjacent interconnect layer. In some embodiments, the conductive vias may improve heat dissipation and may provide structural support. In some embodiments, the plurality of conductive features may be formed of, for example, tungsten, cobalt, zirconium, tantalum, titanium, aluminum, ruthenium, copper, metal carbide (e.g., tantalum carbide, titanium carbide, or tantalum magnesium carbide), metal nitride (e.g., titanium nitride), transition metal aluminides, or a combination thereof. The plurality of conductive features may be formed during the formation of the plurality of dielectric layers.

In some embodiments, the plurality of device elements and the plurality of conductive layers may together comprise functional units of the semiconductor device 1A. In the description of the present disclosure, a functional unit generally refers to functionally related circuitry that has been partitioned for functional purposes into a distinct unit. In some embodiments, the functional units of the semiconductor device 1A may include, for example, highly complex circuits such as processor cores, memory controllers, accelerator units, or other applicable functional circuitry.

With reference to FIG. 2, the first bottom conductive layer 103 may be formed in the mixing area MA. The second bottom conductive layer 105 may be formed in the non-mixing area NMA. In some embodiments, the first bottom conductive layer 103 and the second bottom conductive layer 105 may be referred to as part of the conductive features of the substrate 101. In some embodiments, the first bottom conductive layer 103 and the second bottom conductive layer 105 may be formed of, for example, tungsten, cobalt, zirconium, tantalum, titanium, aluminum, ruthenium, copper, metal carbide (e.g., tantalum carbide, titanium carbide, or tantalum magnesium carbide), metal nitride (e.g., titanium nitride), transition metal aluminide, or a combination thereof. In some embodiments, a width W1 of the first bottom conductive layer 103 and a width W2 of the second bottom conductive layer 105 may be substantially the same. In some embodiments, the width W1 of the first bottom conductive layer 103 and the width W2 of the second bottom conductive layer 105 may be different. Top surfaces of the substrate 101, the first bottom conductive layer 103, and the second bottom conductive layer 105 may be substantially coplanar.

Figure 3:
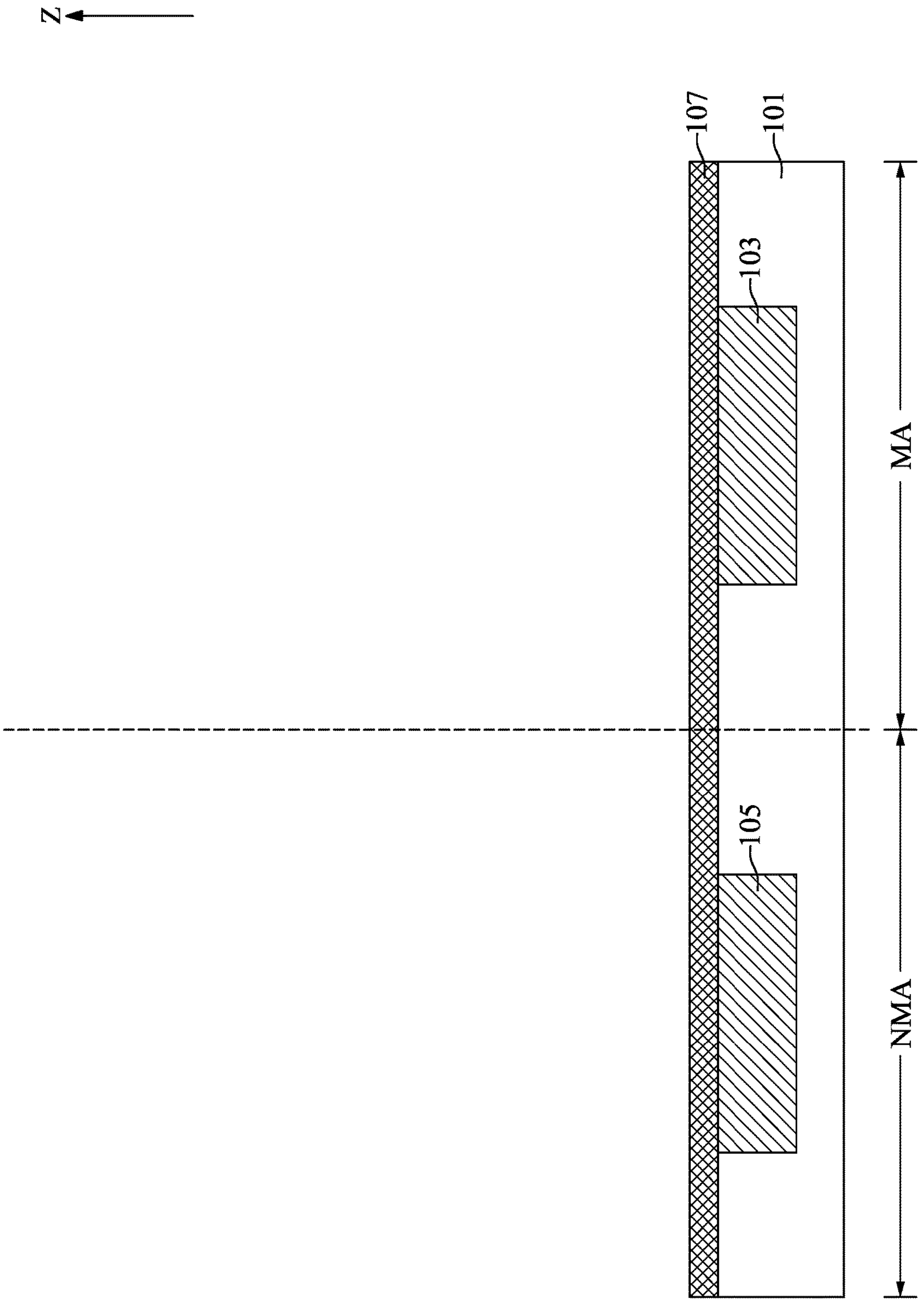

With reference to FIG. 3, the bottom dielectric layer 107 may be formed on the substrate 101 to cover the non-mixing area NMA and the mixing area MA. In some embodiments, the bottom dielectric layer 107 may be formed of a porous dielectric material having a low porosity. For example, the porosity of the bottom dielectric layer 107 may be less than 5%, less than 4%, less than 3%, less than 2%, less than 1%, or 0%. In some embodiments, the bottom dielectric layer 107 may be formed of, for example, silicon oxide. In some embodiments, the bottom dielectric layer 107 may be formed by, for example, chemical vapor deposition, plasma-enhanced chemical vapor deposition, atomic layer deposition, or other applicable deposition processes.

Figure 4:
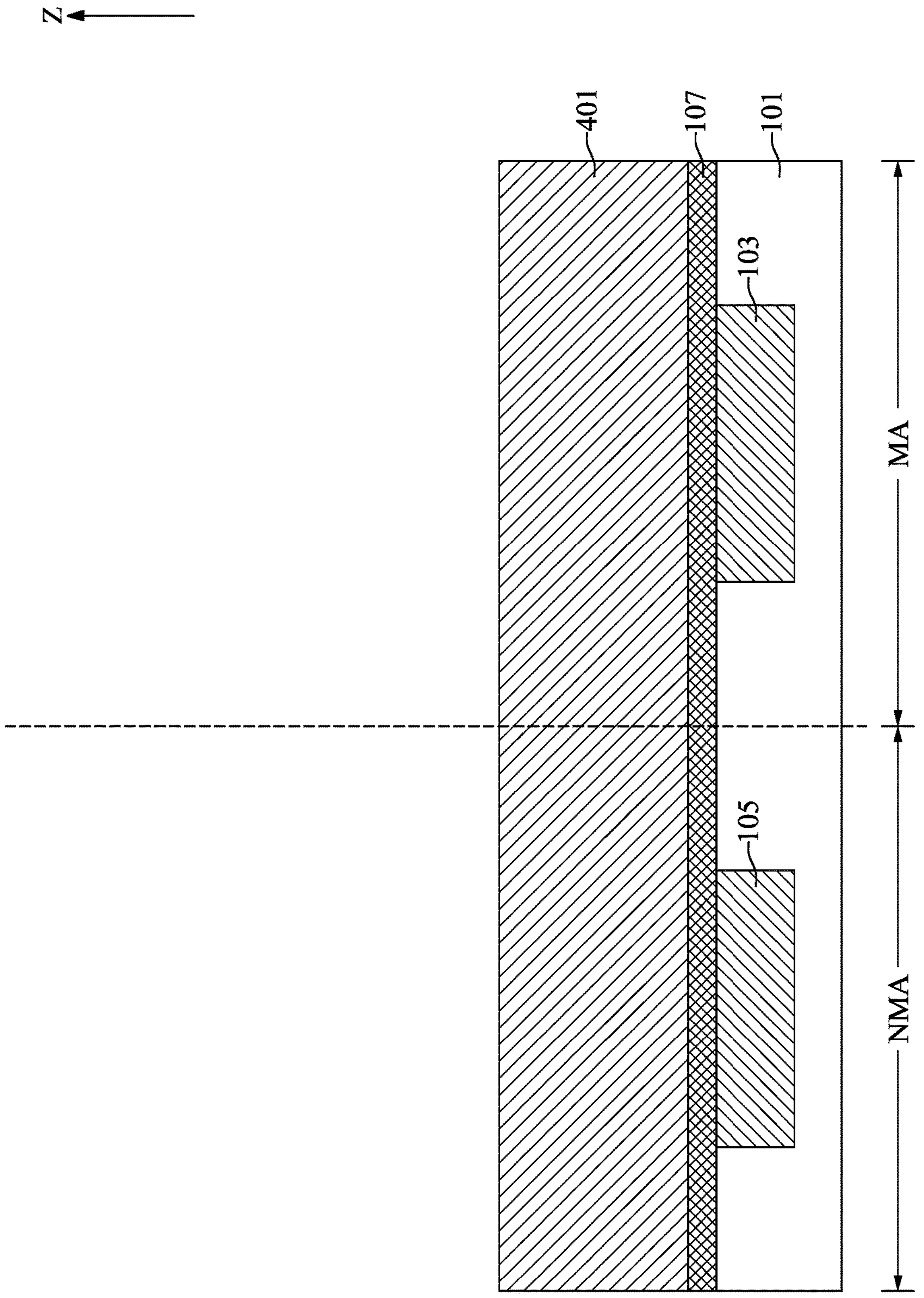

With reference to FIG. 4, the bottom energy-removable layer 401 may be formed on the bottom dielectric layer 107. The bottom energy-removable layer 401 may completely cover the non-mixing area NMA and the mixing area MA. In some embodiments, the bottom energy-removable layer 401 may include a material such as a thermal decomposable material, a photonic decomposable material, an e-beam decomposable material, or a combination thereof. For example, the bottom energy-removable layer 401 may include a base material and a decomposable porogen material that is sacrificially removed upon exposure to an energy source. The base material may include a methylsilsesquioxane-based material. The decomposable porogen material may include a porogen organic compound that provides porosity to the base material of the bottom energy-removable layer 401.

In some embodiments, the bottom energy-removable layer 401 may comprise approximately 55% composition of the decomposable porogen material and approximately 45% composition of the base material. In some embodiments, the bottom energy-removable layer 401 may comprise approximately 45% composition of the decomposable porogen material and approximately 55% composition of the base material. In some embodiments, the bottom energy-removable layer 401 may comprise approximately 35% composition of the decomposable porogen material and approximately 65% composition of the base material. In some embodiments, the bottom energy-removable layer 401 may comprise approximately 25% composition of the decomposable porogen material and approximately 75% composition of the base material. In some embodiments, the bottom energy-removable layer 401 may comprise approximately 15% composition of the decomposable porogen material and approximately 85% composition of the base material.

With reference to FIG. 1 and FIGS. 5 to 12, in step S13, a non-mixing-area conductive structure 200 may be formed on the non-mixing area NMA of the substrate 101.

Figure 5:
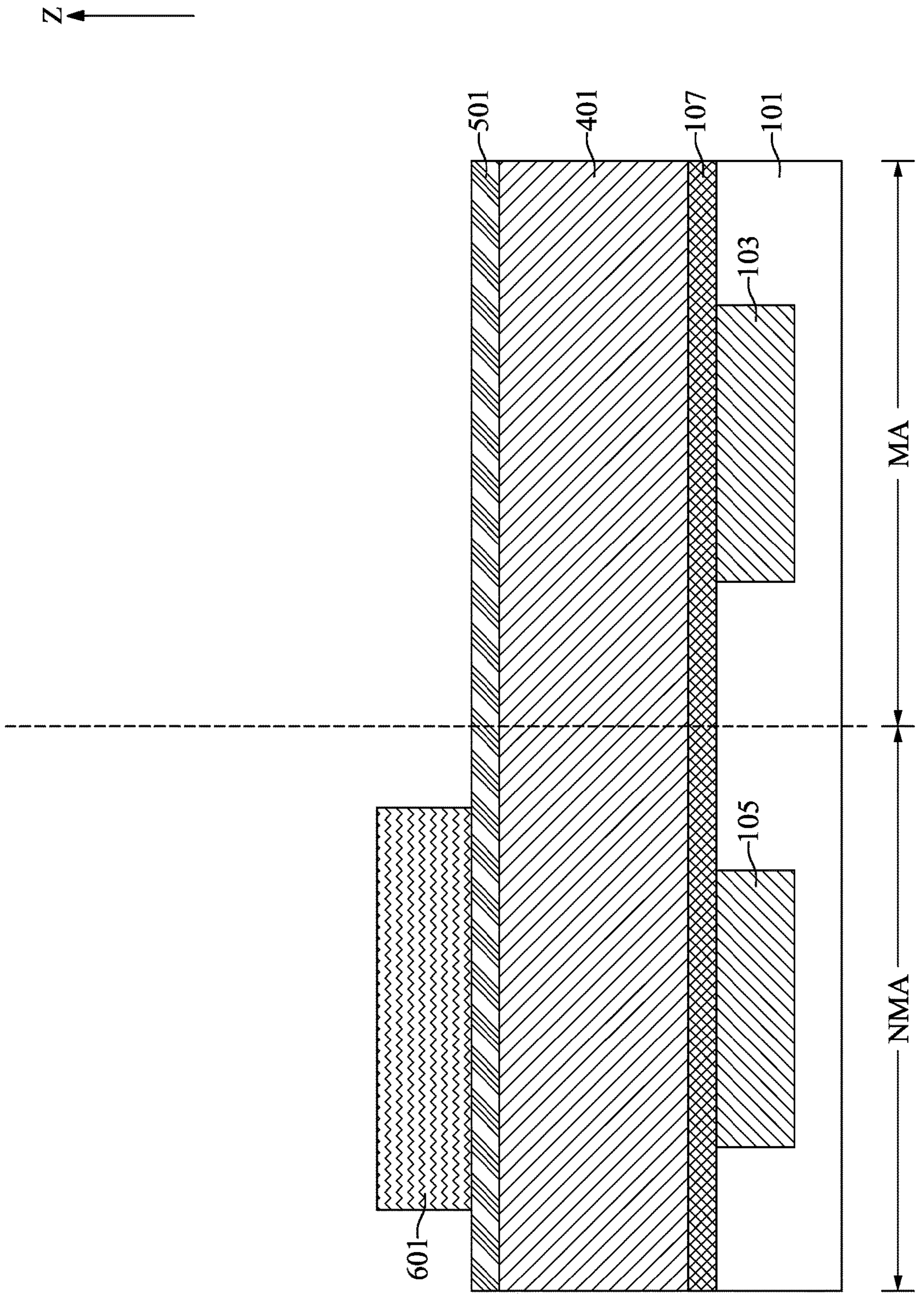

With reference to FIG. 5, a layer of bottom barrier material 501 may be formed on the bottom energy-removable layer 401. The layer of bottom barrier material 501 may completely cover the non-mixing area NMA and the mixing area MA. In some embodiments, the bottom barrier material 501 may be a material having etching selectivity to the material of the bottom energy-removable layer 401. In some embodiments, the bottom barrier material 501 may be a material having etching selectivity to aluminum, copper, or tungsten. In some embodiments, the bottom barrier material 501 may be, for example, silicon nitride, silicon oxynitride, silicon nitride oxide, or a combination thereof. In some embodiments, the layer of bottom barrier material 501 may be formed by, for example, atomic layer deposition, chemical vapor deposition, plasma-enhanced chemical vapor deposition, or other applicable deposition processes.

It should be noted that, in the description of the present disclosure, silicon oxynitride refers to a substance that contains silicon, nitrogen, and oxygen and in which a proportion of oxygen is greater than that of nitrogen. Silicon nitride oxide refers to a substance that contains silicon, oxygen, and nitrogen and in which a proportion of nitrogen is greater than that of oxygen.

With reference to FIG. 5, a first mask layer 601 may be formed on the layer of bottom barrier material 501. In some embodiments, the first mask layer 601 may be a photoresist layer and may include a pattern of a bottom barrier layer 421, which is described below. The pattern of the first mask layer 601 may be formed by performing a photolithography process. The unpatterned first mask layer 601 (not shown in FIG. 5) may be exposed to a process light according to a mask (not shown in FIG. 5). A wavelength of the process light may be associated with a critical dimension of the pattern. In some embodiments, the process light may be a deep ultraviolet (DUV) radiation. In some embodiments, the process light may be an extreme ultraviolet (EUV) radiation, and the photolithography process may be an EUV lithography. After the first mask layer 601 is exposed to the process light, a pattern on the mask is transferred to the unpatterned first mask layer 601. As a result, the unpatterned first mask layer 601 may be etched in accordance with the transferred pattern, thereby forming the pattern on the first mask layer 601.

Figure 6:
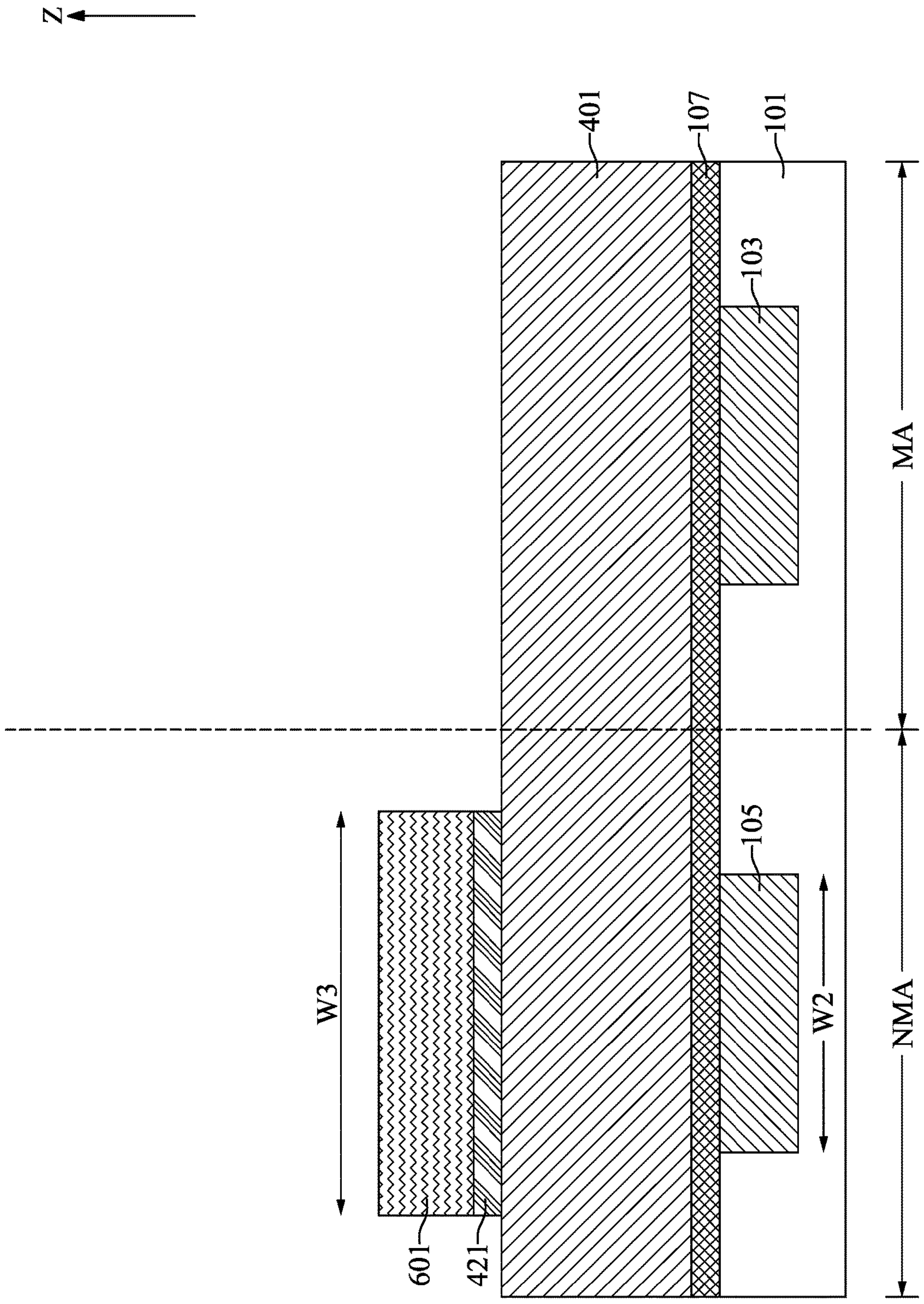

With reference to FIG. 6, a first barrier etching process may be performed using the first mask layer 601 as a mask to remove a portion of the bottom barrier material 501. In some embodiments, during the first barrier etching process, a ratio of an etch rate of the bottom barrier material 501 to an etch rate of the bottom energy-removable layer 401 may be between about 100:1 and about 1.05:1, between about 15:1 and about 3:1, or between about 10:1 and about 5:1. After the first barrier etching process, the remaining bottom barrier material 501 may be turned into the bottom barrier layer 421. The bottom barrier layer 421 may be formed above the non-mixing area NMA and on the bottom energy-removable layer 401. In some embodiments, a width W3 of the bottom barrier layer 421 may be greater than the width W2 of the second bottom conductive layer 105. In some embodiments, the width W3 of the bottom barrier layer 421 may be substantially the same as the width W2 of the second bottom conductive layer 105. In some embodiments, the width W3 of the bottom barrier layer 421 may be less than the width W2 of the second bottom conductive layer 105. The first mask layer 601 may be removed after the formation of the bottom barrier layer 421.

Figure 7:
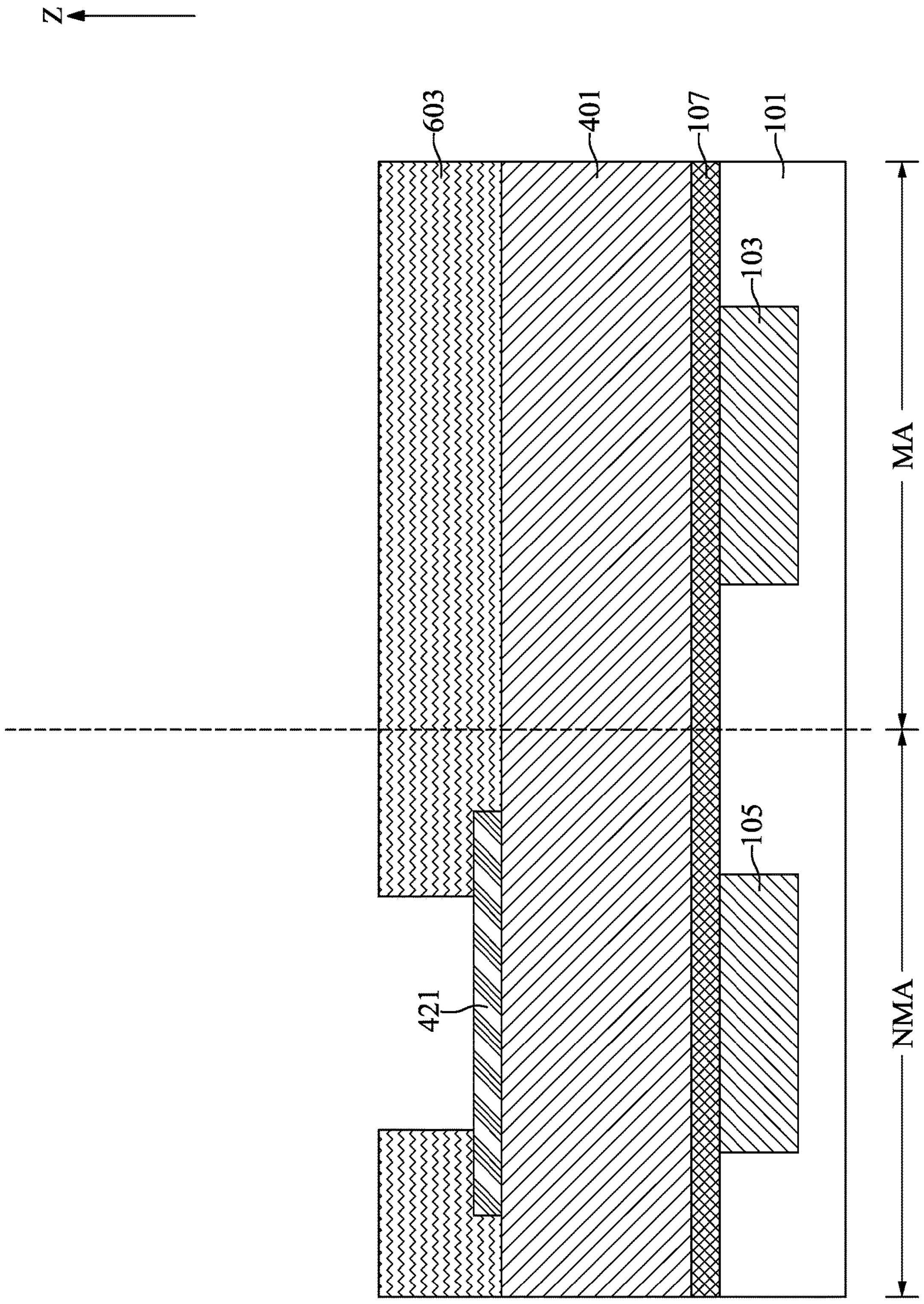

With reference to FIG. 7, a second mask layer 603 may be formed on the bottom energy-removable layer 401 and may cover a portion of the bottom barrier layer 421. The second mask layer 603 may include a pattern of a non-mixing-area recess R1, which is described below. The pattern of the second mask layer 603 may be formed using a procedure similar to that of the first mask layer 601, and descriptions thereof are not repeated herein.

Figure 8:
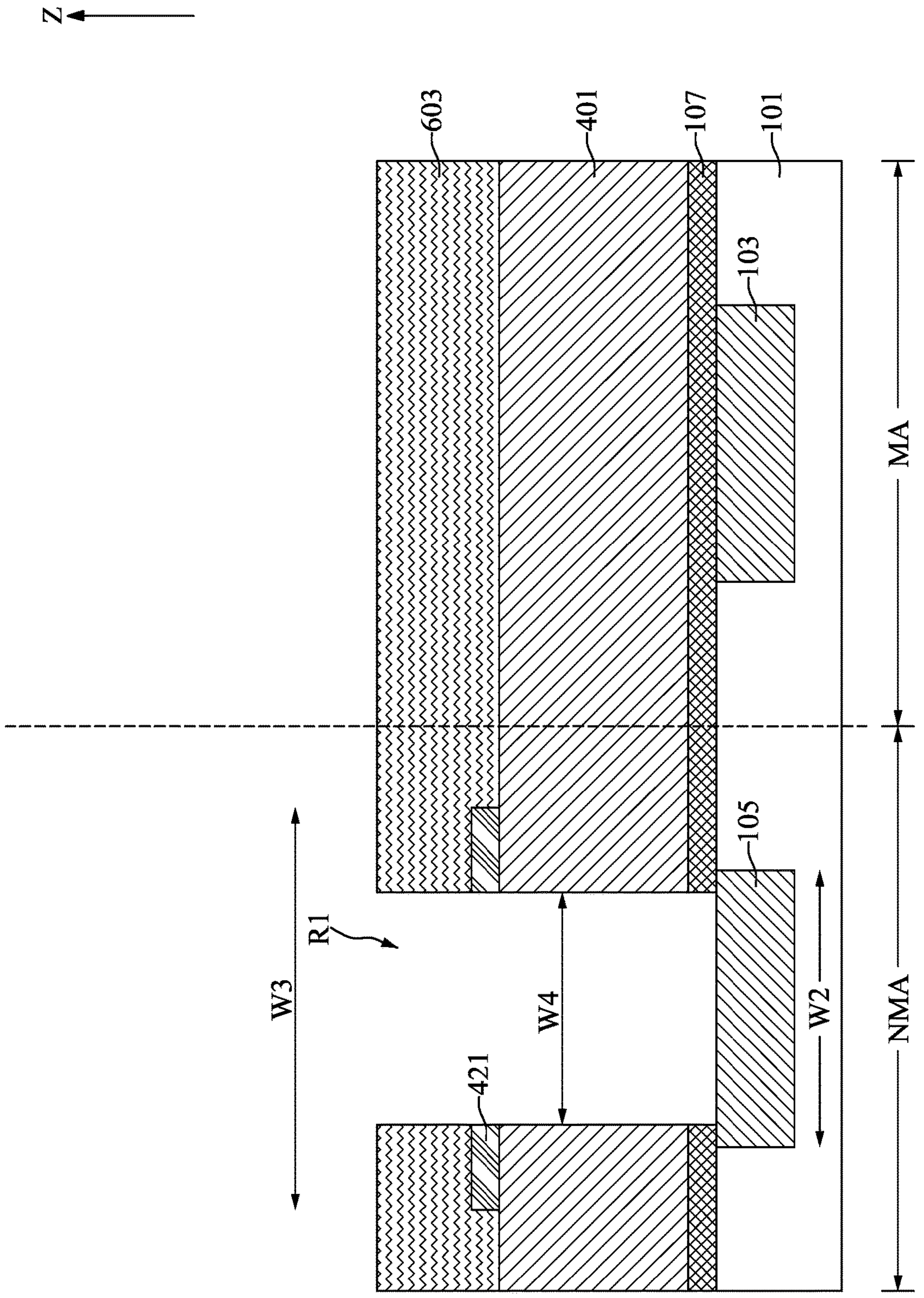

With reference to FIG. 8, a first recess etching process may be performed to remove portions of the bottom barrier layer 421, the bottom energy-removable layer 401, and the bottom dielectric layer 107. In some embodiments, the first recess etching process may be a multi-stage etching process. For example, the first recess etching process may be a three-stage anisotropic dry etching process. An etching chemistry of the first recess etching process may be different for each stage so as to provide different etching selectivities. In some embodiments, during the first stage of the first recess etching process, a ratio of an etch rate of the bottom barrier layer 421 to the etch rate of the bottom energy-removable layer 401 may be between about 100:1 and about 1.05:1, between about 15:1 and about 2:1, or between about 10:1 and about 2:1. In some embodiments, during the second stage of the first recess etching process, a ratio of the etch rate of the bottom energy-removable layer 401 to an etch rate of the bottom dielectric layer 107 may be between about 100:1 and about 1.05:1, between about 15:1 and about 2:1, or between about 10:1 and about 2:1. In some embodiments, during the third stage of the first recess etching process, a ratio of the etch rate of the bottom dielectric layer 107 to an etch rate of the second bottom conductive layer 105 may be between about 100:1 and about 1.05:1, between about 15:1 and about 2:1, or between about 10:1 and about 2:1.

With reference to FIG. 8, after the first recess etching process, the non-mixing-area recess R1 may be formed in the bottom barrier layer 421, the bottom energy-removable layer 401, and the bottom dielectric layer 107. The second bottom conductive layer 105 may be partially exposed through the non-mixing-area recess R1. In some embodiments, a width W4 of the non-mixing-area recess R1 may be less than the width W2 of the second bottom conductive layer 105 and less than the width W3 of the bottom barrier layer 421. After the formation of the non-mixing-area recess R1, the second mask layer 603 may be removed.

Figure 9:
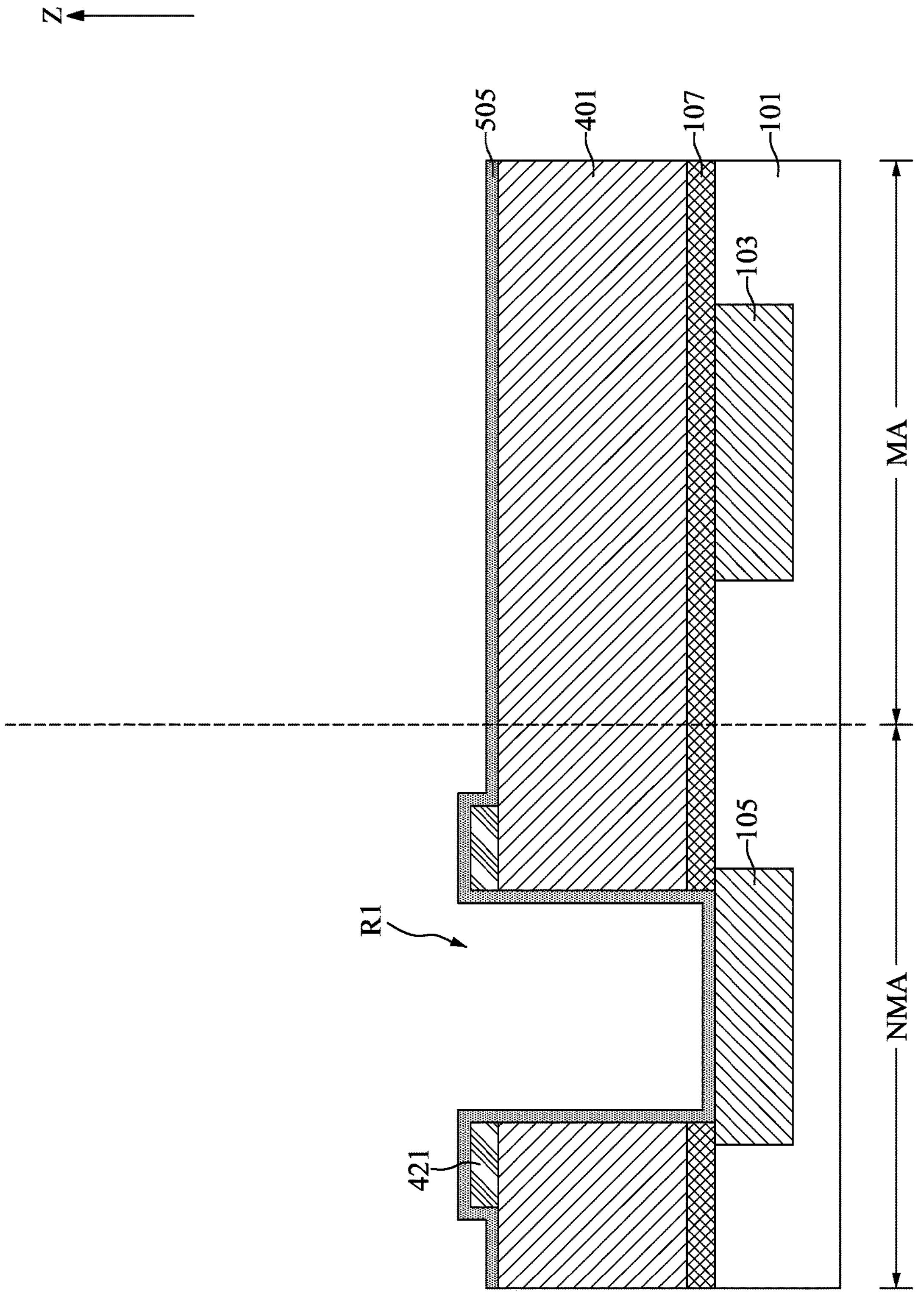

With reference to FIG. 9, a layer of first liner material 505 may be conformally formed on the bottom energy-removable layer 401, on the bottom barrier layer 421, on the non-mixing-area recess R1, and on the second bottom conductive layer 105. In some embodiments, the first liner material 505 may include, for example, titanium, titanium nitride, tantalum, tantalum nitride, or a combination thereof. In some embodiments, the first liner material 505 may be formed by, for example, chemical vapor deposition, atomic layer deposition, plasma-enhanced chemical vapor deposition, or other applicable deposition processes.

For example, the layer of first liner material 505 may be formed by chemical vapor deposition. In some embodiments, the formation of the layer of first liner material 505 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain a desired thickness of the layer of first liner material 505.

The intermediate semiconductor device illustrated in FIG. 8 may be loaded into a reaction chamber. In the source gas introducing step, source gases containing a precursor and a reactant may be introduced into the reaction chamber containing the intermediate semiconductor device. The precursor and the reactant may diffuse across a boundary layer and reach a surface of the intermediate semiconductor device (i.e., surfaces of the bottom energy-removable layer 401, the bottom barrier layer 421, the non-mixing-area recess R1, and the second bottom conductive layer 105). The precursor and the reactant may adsorb on and subsequently migrate on the aforementioned surface. The adsorbed precursor and the adsorbed reactant may react on the aforementioned surface and form solid byproducts. The solid byproducts may form nuclei on the aforementioned surface. The nuclei may grow into islands and the islands may merge into a continuous thin film on the aforementioned surface. In the first purging step, a purge gas such as argon may be injected into the reaction chamber to purge out gaseous byproducts, unreacted precursor, and unreacted reactant.

In the reactant flowing step, the reactant may be solely introduced into the reaction chamber to turn the continuous thin film into the layer of first liner material 505. In the second purging step, a purge gas such as argon may be injected into the reaction chamber to purge out the gaseous byproducts and the unreacted reactant.

In some embodiments, the formation of the layer of first liner material 505 using chemical vapor deposition may be performed with assistance of plasma. A source of the plasma may be, for example, argon, hydrogen, or a combination thereof.

In some embodiments, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of first liner material 505.

In other embodiments, the layer of first liner material 505 may be formed by atomic layer deposition such as photo-assisted atomic layer deposition or liquid injection atomic layer deposition. In some embodiments, forming the layer of first liner material 505 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain a desired thickness of the layer of first liner material 505.

The intermediate semiconductor device illustrated in FIG. 8 may be loaded into the reaction chamber. In the first precursor introducing step, a first precursor may be introduced into the reaction chamber. The first precursor may diffuse across a boundary layer and reach the surface of the intermediate semiconductor device (i.e., the surfaces of the bottom energy-removable layer 401, the bottom barrier layer 421, the non-mixing-area recess R1, and the second bottom conductive layer 105). The first precursor may adsorb on the aforementioned surface to form a monolayer at a single atomic layer level. In the first purging step, a purge gas such as argon may be injected into the reaction chamber to purge out unreacted first precursor.

In the second precursor introducing step, a second precursor may be introduced into the reaction chamber. The second precursor may react with the monolayer and turn the monolayer into the layer of first liner material 505. In the second purging step, a purge gas such as argon may be injected into the reaction chamber to purge out unreacted second precursor and gaseous byproduct. Compared to a chemical vapor deposition, particle generation caused by a gas phase reaction may be suppressed because the first precursor and the second precursor are separately introduced.

In some embodiments, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of first liner material 505.

In some embodiments, the formation of the layer of first liner material 505 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced into the reaction chamber. The co-reactants may be selected from the group consisting of hydrogen, hydrogen plasma, oxygen, air, water, ammonia, hydrazines, alkylhydrazines, boranes, silanes, ozone, and combinations thereof.

In some embodiments, the formation of the layer of first liner material 505 may be performed using the following process conditions. A substrate temperature may be between about 160° C. and about 300° C. An evaporator temperature may be about 175° C. A pressure of the reaction chamber may be about 5 mbar. A solvent for the first precursor and the second precursor may be toluene.

Figure 10:
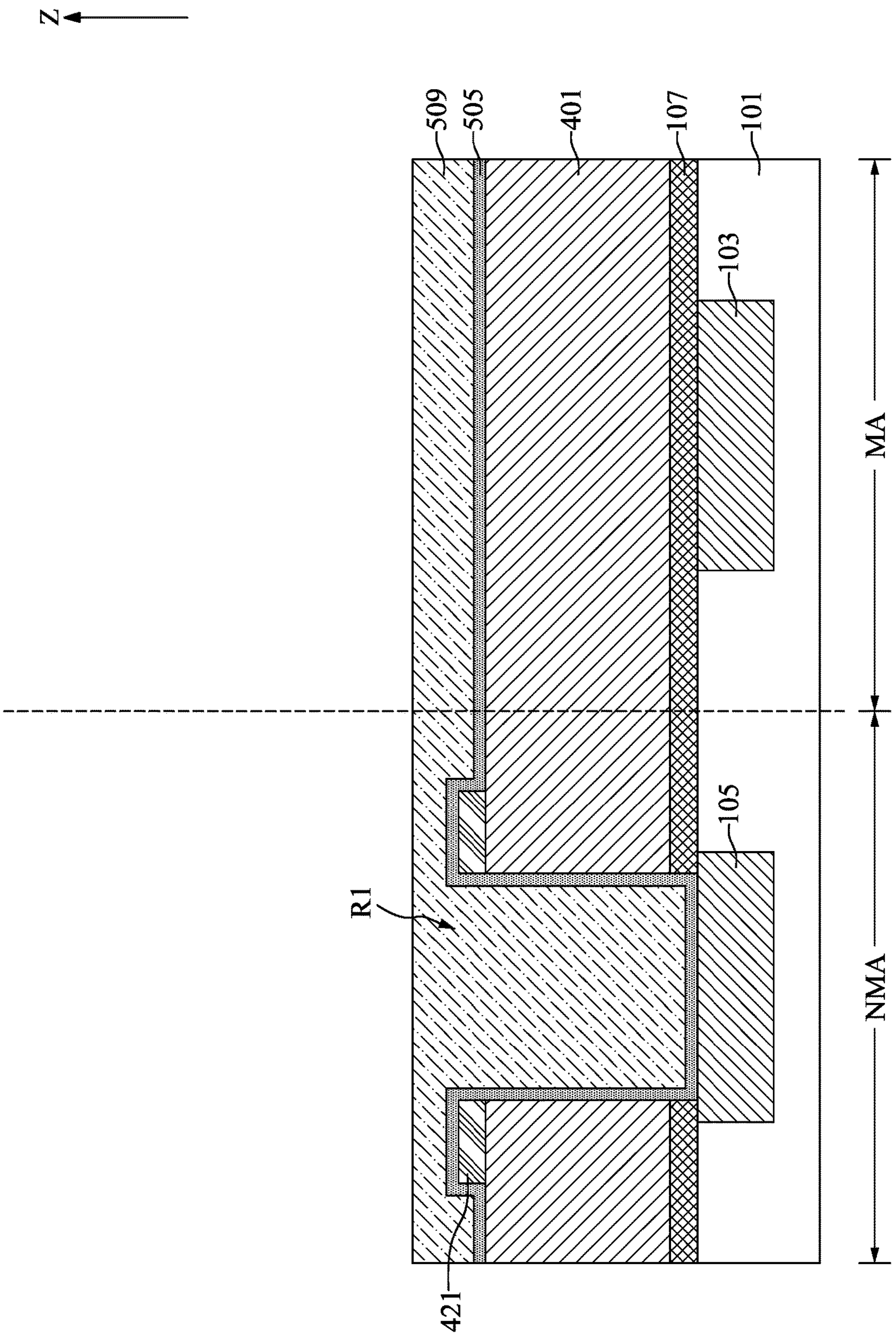

With reference to FIG. 10, a layer of first conductive material 509 may be formed on the layer of first liner material 505 and may completely fill the non-mixing-area recess R1. In some embodiments, the first conductive material 509 may include aluminum, copper, tungsten, or a combination thereof. In some embodiments, the layer of first conductive material 509 may be formed by, for example, physical vapor deposition, sputtering, electroplating, electroless plating, chemical vapor deposition, or other applicable deposition processes.

In some embodiments, a planarization process, such as chemical mechanical polishing, may be performed on the layer of first conductive material 509 to provide a substantially flat surface for subsequent processing steps.

Figure 11:
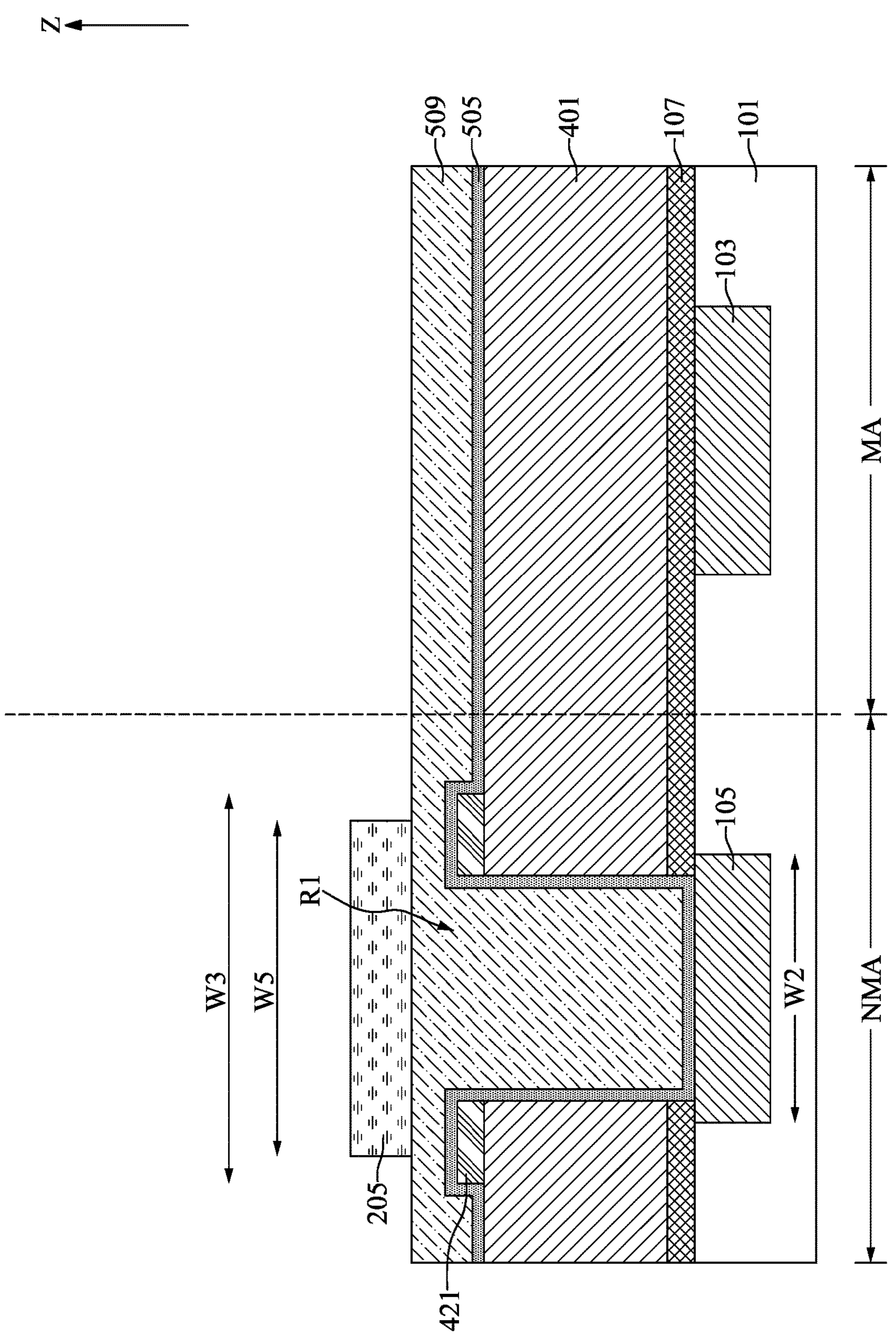

With reference to FIG. 11, a non-mixing-area hard mask layer 205 may be formed on the layer of first conductive material 509 and above the bottom barrier layer 421. In some embodiments, a width W5 of the non-mixing-area hard mask layer 205 may be less than the width W3 of the bottom barrier layer 421. In some embodiments, the width W5 of the non-mixing-area hard mask layer 205 may be greater than the width W2 of the second bottom conductive layer 105. In some embodiments, the width W5 of the non-mixing-area hard mask layer 205 and the width W2 of the second bottom conductive layer 105 may be substantially the same.

In some embodiments, the non-mixing-area hard mask layer 205 may be formed of, for example, a material having etching selectivity to the first conductive material 509, the first liner material 505, or the material of the bottom barrier layer 421. In some embodiments, the non-mixing-area hard mask layer 205 may be formed of, for example, silicon, silicon germanium, tetraethyl orthosilicate, silicon nitride, silicon oxynitride, silicon nitride oxide, silicon carbide, the like, or a combination thereof. In some embodiments, the non-mixing-area hard mask layer 205 may be formed by a deposition process such as chemical vapor deposition, plasma-enhanced chemical vapor deposition, atomic layer deposition, or the like. A process temperature of the formation of the non-mixing-area hard mask layer 205 may be less than 400° C.

In some embodiments, the non-mixing-area hard mask layer 205 may be formed of, for example, boron nitride, silicon boron nitride, phosphorus boron nitride, boron carbon silicon nitride, or the like. In some embodiments, the non-mixing-area hard mask layer 205 may be formed by a film formation process and a treatment process. In the film formation process, first precursors, which may be boron-based precursors, may be introduced over the layer of first conductive material 509 to form a boron-based layer. Subsequently, in the treatment process, second precursors, which may be nitrogen-based, may be introduced to react with the boron-based layer and turn the boron-based layer into the non-mixing-area hard mask layer 205.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without assistance of plasma. In such embodiments, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such embodiments, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be generated by an RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced with the second precursors in the treatment process. The oxygen-based precursors may be, for example, oxygen, nitric oxide, nitrous oxide, carbon dioxide, or water.

In some embodiments, silicon-based precursors may be introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced with the second precursors in the treatment process. The phosphorus-based precursors may be, for example, phosphine.

In some embodiments, oxygen-based precursors, silicon-based precursors, or phosphorus-based precursors may be introduced with the second precursors in the treatment process.

In some embodiments, the treatment process may be assisted by a plasma process, a UV cure process, a thermal anneal process, or a combination thereof.

When the treatment is performed with the assistance of the plasma process, the plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency greater than about 13.6 MHz. In such embodiments, a substrate temperature of the treatment process may be between about 20° C. and about 1000° C. A process pressure of the treatment process may be between about 10 mTorr and about 760 Torr.

When the treatment is performed with the assistance of the UV cure process, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light-emitting diode arrays. The UV source may have a wavelength of between about 170 nm and about 400 nm. The UV source may provide a photon energy between about 0.5 eV and about 10 eV, or between about 1 eV and about 6 eV. The assistance of the UV cure process may remove hydrogen from the non-mixing-area hard mask layer 205. As hydrogen may diffuse into other areas of the semiconductor device 1A and may degrade the reliability of the semiconductor device 1A, the removal of hydrogen with the assistance of the UV cure process may improve reliability of the semiconductor device 1A. In addition, the UV cure process may increase a density of the non-mixing-area hard mask layer 205.

When the treatment is performed with the assistance of the thermal anneal process, a substrate temperature of the treatment process may be between about 20° C. and about 1000° C. A process pressure of the treatment process may be between about 10 mTorr and about 760 Torr.

Figure 12:
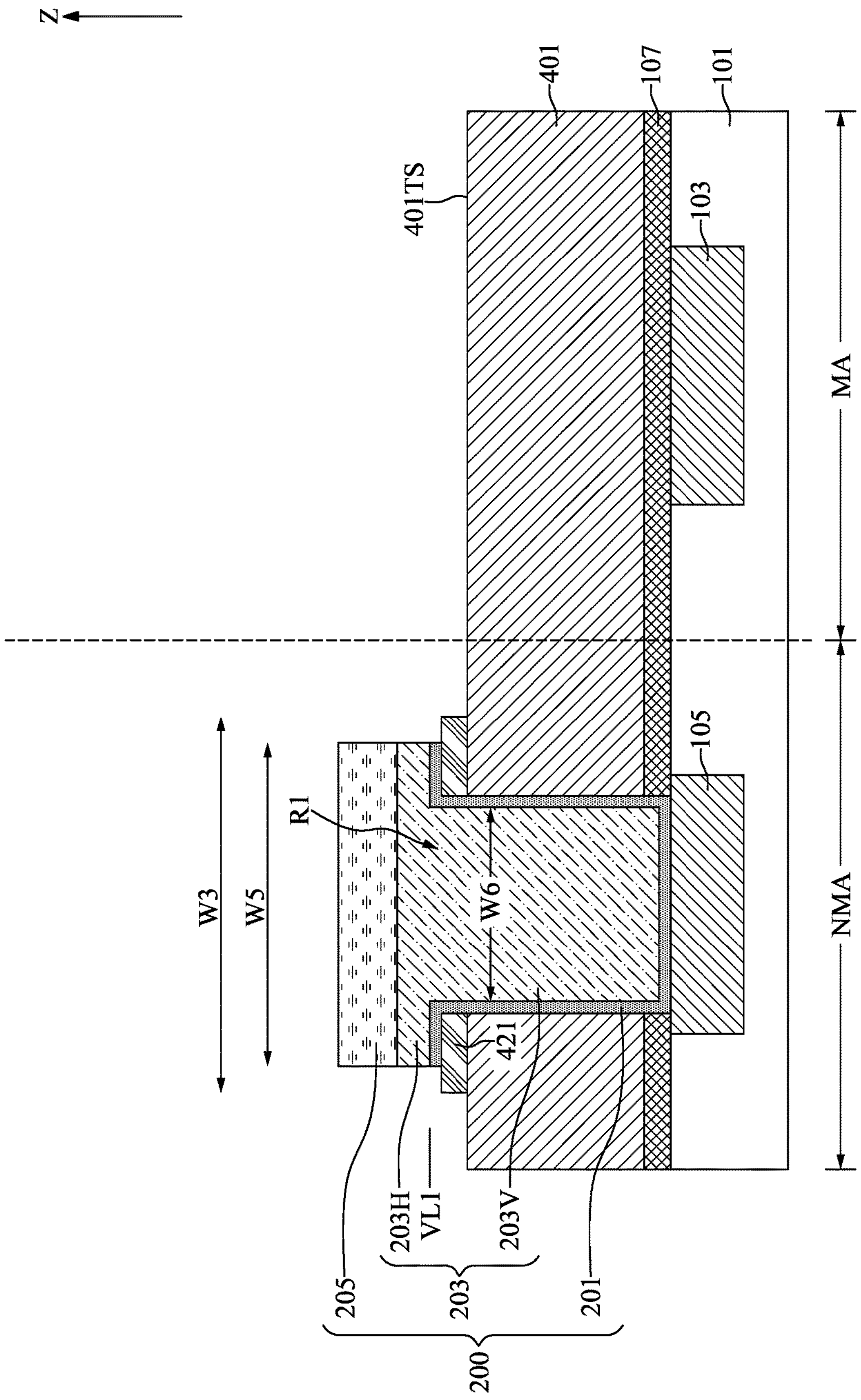

With reference to FIG. 12, a first etching process may be performed using the non-mixing-area hard mask layer 205 as a mask to remove portions of the first conductive material 509 and the first liner material 505. In some embodiments, the first etching process may be a multi-stage etching process. For example, the first etching process may be a two-stage anisotropic dry etching process. The etching chemistry may be different for each stage to provide different etching selectivities. In some embodiments, during the first stage of the first etching process, a ratio of an etch rate of the first conductive material 509 to an etch rate of the non-mixing-area hard mask layer 205 may be between about 100:1 and about 1.05:1, between about 15:1 and about 5:1, or between about 10:1 and about 3:1. In some embodiments, during the first stage of the first etching process, a ratio of the etch rate of the first conductive material 509 to an etch rate of the first liner material 505 may be between about 100:1 and about 1.05:1, between about 15:1 and about 5:1, or between about 10:1 and about 3:1.

In some embodiments, during the second stage of the first etching process, a ratio of the etch rate of the first liner material 505 to the etch rate of the non-mixing-area hard mask layer 205 may be between about 100:1 and about 1.05:1, between about 15:1 and about 5:1, or between about 10:1 and about 3:1. In some embodiments, during the second stage of the first etching process, a ratio of the etch rate of the first liner material 505 to the etch rate of the bottom barrier layer 421 may be between about 100:1 and about 1.05:1, between about 15:1 and about 5:1, or between about 10:1 and about 3:1. In some embodiments, during the second stage of the first etching process, a ratio of the etch rate of the first liner material 505 to the etch rate of the bottom energy-removable layer 401 may be between about 100:1 and about 1.05:1, between about 15:1 and about 5:1, or between about 10:1 and about 3:1.

With reference to FIG. 12, after the first etching process, the remaining first conductive material 509 may be referred to as the non-mixing-area conductive layer 203. The remaining first liner material 505 may be referred to as the non-mixing-area liner layer 201. The non-mixing-area liner layer 201, the non-mixing-area conductive layer 203, and the non-mixing-area hard mask layer 205 together comprise the non-mixing-area conductive structure 200. The non-mixing-area conductive structure 200 may be formed on the second bottom conductive layer 105 and on the non-mixing area NMA.

With reference to FIG. 12, the non-mixing-area conductive layer 203 may include a vertical portion 203V and a horizontal portion 203H. The vertical portion 203V may be disposed on the second bottom conductive layer 105 and in the non-mixing-area recess R1. A top part of the vertical portion 203V may protrude from a top surface 401TS of the bottom energy-removable layer 401 and may be surrounded by the bottom barrier layer 421. In other words, a top surface of the vertical portion 203V may be at a vertical level VL1 higher than the top surface 401TS of the bottom energy-removable layer 401. A bottom part of the vertical portion 203V may be surrounded by the bottom dielectric layer 107. In some embodiments, a width W6 of the vertical portion 203V may be less than the width W5 of the non-mixing-area hard mask layer 205.

With reference to FIG. 12, the horizontal portion 203H may be disposed on the vertical portion 203V and on the bottom barrier layer 421. In some embodiments, the horizontal portion 203H may have the same width W5 as the non-mixing-area hard mask layer 205. In some embodiments, the width W5 of the horizontal portion 203H may be greater than the width W6 of the vertical portion 203V. That is, the non-mixing-area conductive layer 203 may have a T-shaped cross-sectional profile. In some embodiments, the width W5 of the horizontal portion 203H may be less than the width W3 of the bottom barrier layer 421.

With reference to FIG. 12, the non-mixing-area liner layer 201 may be conformally disposed between the non-mixing-area conductive layer 203 and the bottom energy-removable layer 401, between the non-mixing-area conductive layer 203 and the bottom barrier layer 421, between the non-mixing-area conductive layer 203 and the bottom dielectric layer 107, and between the non-mixing-area conductive layer 203 and the second bottom conductive layer 105. The non-mixing-area liner layer 201 may be conformally disposed between the horizontal portion 203H and the bottom barrier layer 421, between the vertical portion 203V and the bottom barrier layer 421, between the vertical portion 203V and the bottom energy-removable layer 401, between the vertical portion 203V and the bottom dielectric layer 107, and between the vertical portion 203V and the second bottom conductive layer 105. The non-mixing-area liner layer 201 may improve adhesion between the non-mixing-area conductive layer 203 and the bottom barrier layer 421, between the non-mixing-area conductive layer 203 and the bottom energy-removable layer 401, between the non-mixing-area conductive layer 203 and the bottom dielectric layer 107, and between the non-mixing-area conductive layer 203 and the second bottom conductive layer 105. The non-mixing-area liner layer 201 may also prevent metal ion diffusion from the non-mixing-area conductive layer 203 to the bottom energy-removable layer 401 or the substrate 101.

With reference to FIG. 1 and FIGS. 13 to 21, in step S15, a mixing-area conductive structure 300 may be formed on the mixing area MA of the substrate 101.

Figure 13:
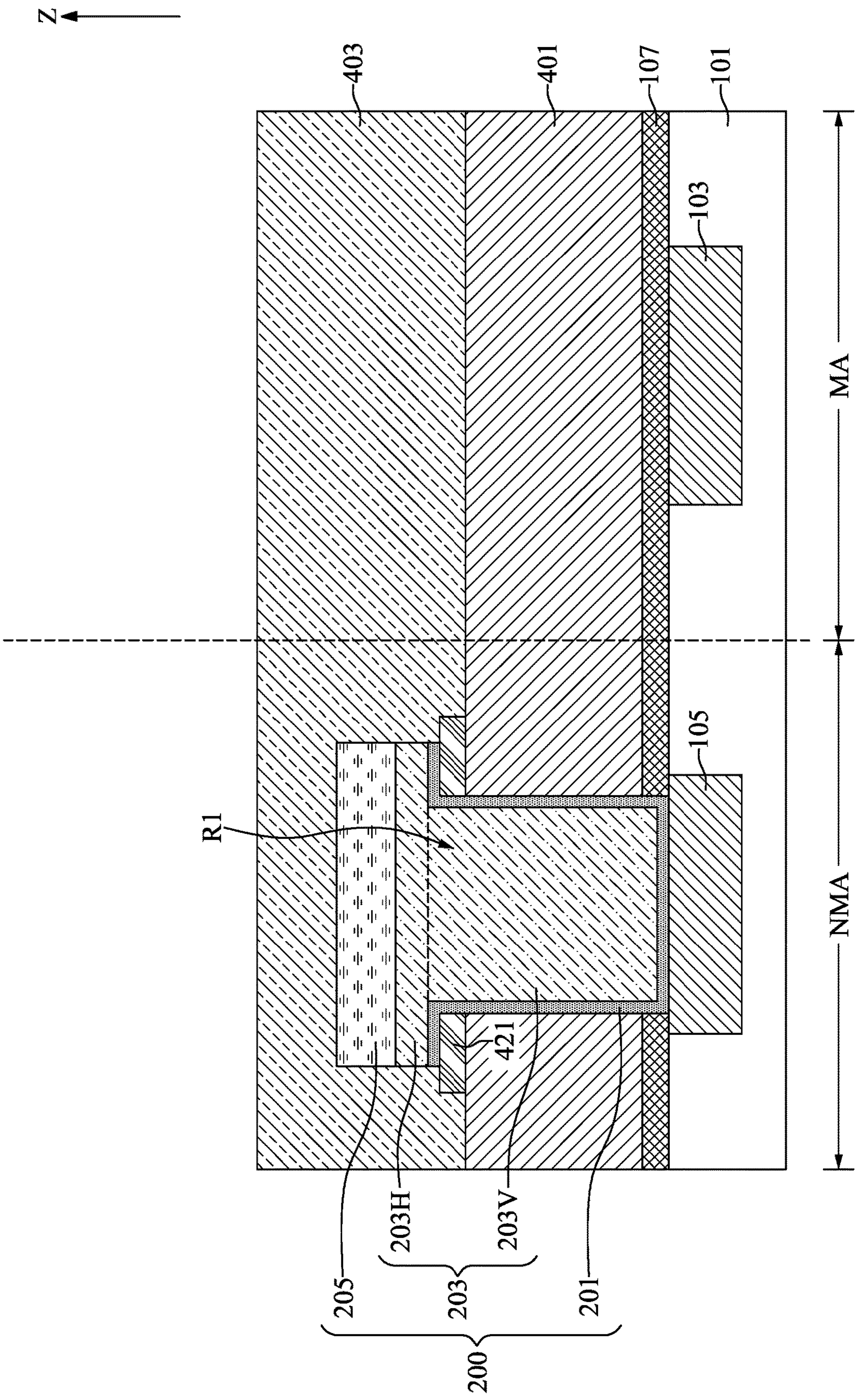

With reference to FIG. 13, a top energy-removable layer 403 may be formed on the bottom energy-removable layer 401 and may cover the non-mixing-area conductive structure 200 and the bottom barrier layer 421. The top energy-removable layer 403 may completely cover the non-mixing area NMA and the mixing area MA. In some embodiments, the top energy-removable layer 403 may include a material such as a thermal decomposable material, a photonic decomposable material, an e-beam decomposable material, or a combination thereof. For example, the top energy-removable layer 403 may include a base material and a decomposable porogen material that is sacrificially removed upon exposure to an energy source. The base material may include a methylsilsesquioxane based material. The decomposable porogen material may include a porogen organic compound that provides porosity to the base material of the top energy-removable layer 403.

In some embodiments, a percent composition of the base material in the top energy-removable layer 403 may be less than a percent composition of the base material in the bottom energy-removable layer 401. In some embodiments, the top energy-removable layer 403 may comprise approximately 55% composition of the decomposable porogen material, and approximately 45% composition of the base material. In some embodiments, the top energy-removable layer 403 may comprise approximately 65% composition of the decomposable porogen material, and approximately 35% composition of the base material. In some embodiments, the top energy-removable layer 403 may comprise approximately 75% composition of the decomposable porogen material, and approximately 25% composition of the base material. In some embodiments, the top energy-removable layer 403 may comprise approximately 85% composition of the decomposable porogen material, and approximately 15% composition of the base material.

In some embodiments, a planarization process, such as chemical mechanical polishing, may be performed to provide a substantially flat surface for subsequent processing steps.

Figure 14:
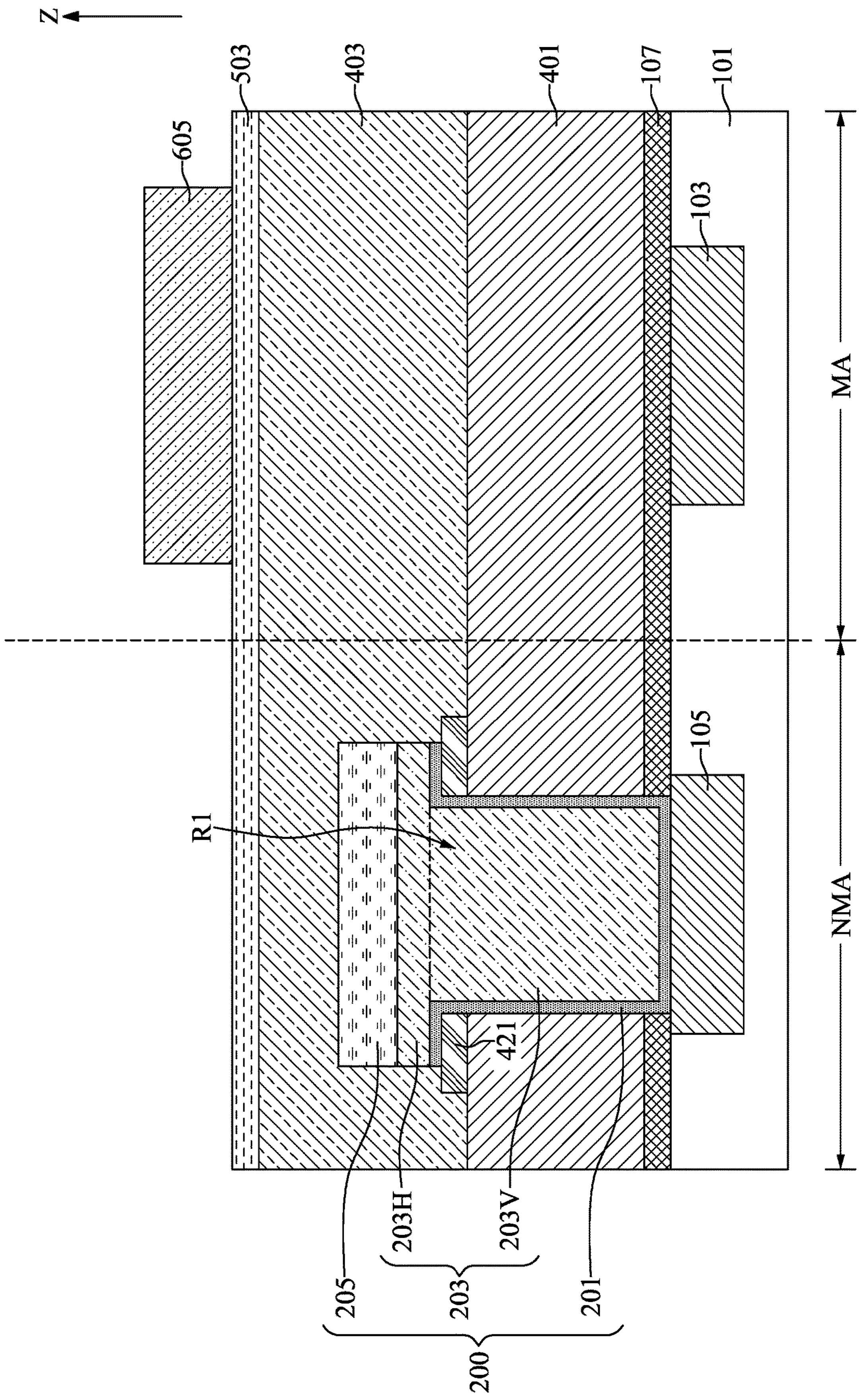

With reference to FIG. 14, a layer of top barrier material 503 may be formed on the top energy-removable layer 403. The layer of top barrier material 503 may completely cover the non-mixing area NMA and the mixing area MA. In some embodiments, the top barrier material 503 may be a material having etching selectivity to the material of the top energy-removable layer 403. In some embodiments, the top barrier material 503 may be a material having etching selectivity to aluminum, copper, or tungsten. In some embodiments, the top barrier material 503 may be, for example, silicon nitride, silicon oxynitride, silicon nitride oxide, or a combination thereof. In some embodiments, the layer of top barrier material 503 may be formed by, for example, atomic layer deposition, chemical vapor deposition, plasma-enhanced chemical vapor deposition, or other applicable deposition processes.

With reference to FIG. 14, a third mask layer 605 may be formed on the layer of top barrier material 503. In some embodiments, the third mask layer 605 may be a photoresist layer and may include a pattern of a top barrier layer 423, which is described below. The pattern of the third mask layer 605 may be formed by performing a photolithography process. The unpatterned third mask layer 605 (not shown in FIG. 14) may be exposed to process light according to a mask (not shown in FIG. 14). A wavelength of the process light may be associated with a critical dimension of the pattern. In some embodiments, the process light may be a deep ultraviolet (DUV) radiation. In some embodiments, the process light may be an extreme ultraviolet (EUV) radiation, and the photolithography process may be an EUV lithography. After the unpatterned third mask layer 605 is exposed to the process light, a pattern on the mask is transferred to the unpatterned third mask layer 605. As a result, the unpatterned third mask layer 605 may be etched in accordance with the transferred pattern, thereby forming the pattern on the third mask layer 605.

Figure 15:
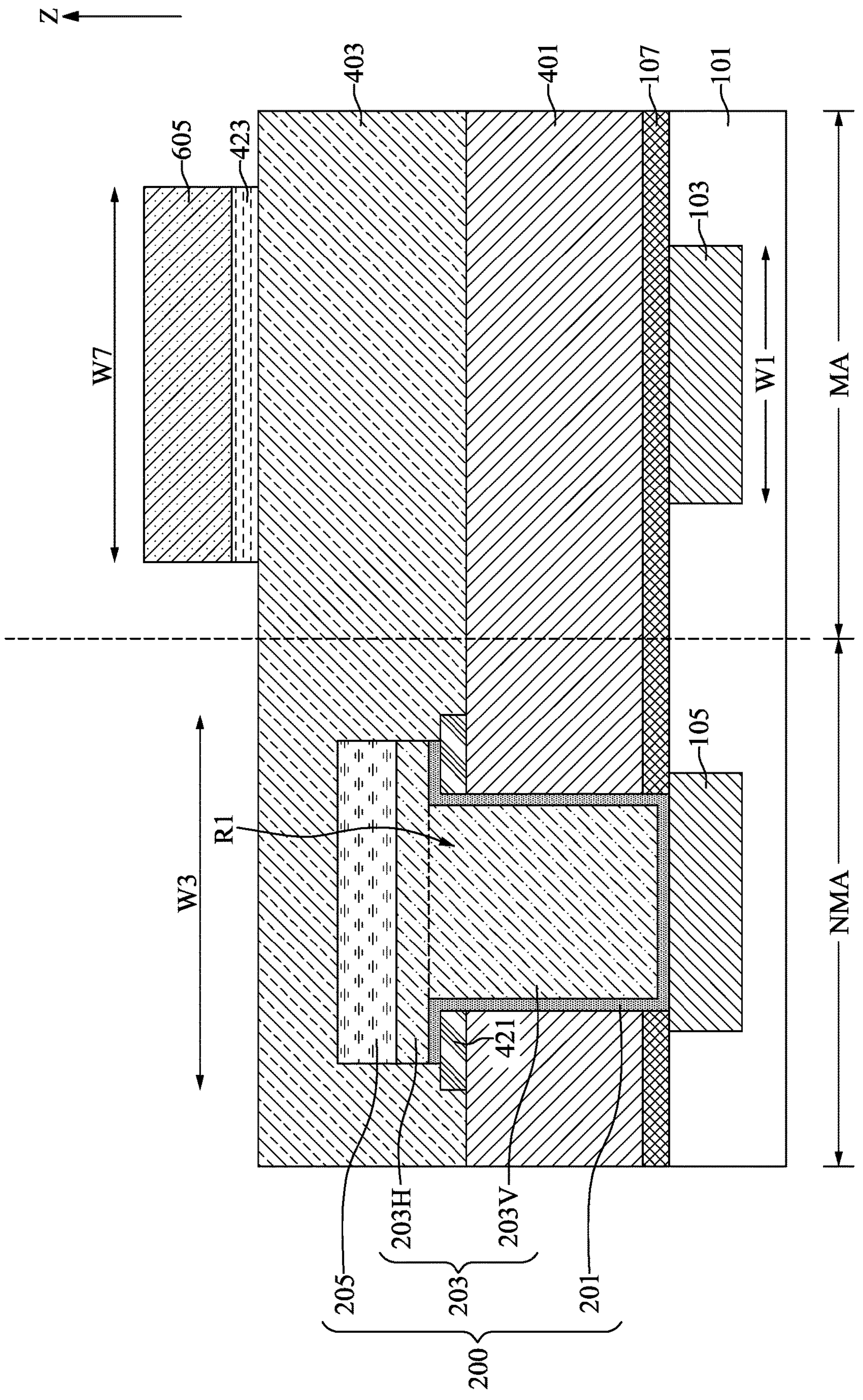

With reference to FIG. 15, a second barrier etching process may be performed using the third mask layer 605 as a mask to remove a portion of the top barrier material 503. In some embodiments, during the second barrier etching process, a ratio of an etch rate of the top barrier material 503 to an etch rate of the top energy-removable layer 403 may be between about 100:1 and about 1.05:1, between about 15:1 and about 3:1, or between about 10:1 and about 5:1. After the second barrier etching process, the remaining top barrier material 503 may be turned into the top barrier layer 423. The top barrier layer 423 may be formed above the mixing area MA and on the top energy-removable layer 403.

In some embodiments, a width W7 of the top barrier layer 423 may be greater than the width W1 of the first bottom conductive layer 103. In some embodiments, the width W7 of the top barrier layer 423 may be substantially the same as the width W1 of the first bottom conductive layer 103. In some embodiments, the width W7 of the top barrier layer 423 may be less than the width W1 of the first bottom conductive layer 103. In some embodiments, the width W7 of the top barrier layer 423 and the width W3 of the bottom barrier layer 421 may be substantially the same. In some embodiments, the width W7 of the top barrier layer 423 and the width W3 of the bottom barrier layer 421 may be different. The third mask layer 605 may be removed after the formation of the top barrier layer 423.

Figure 16:
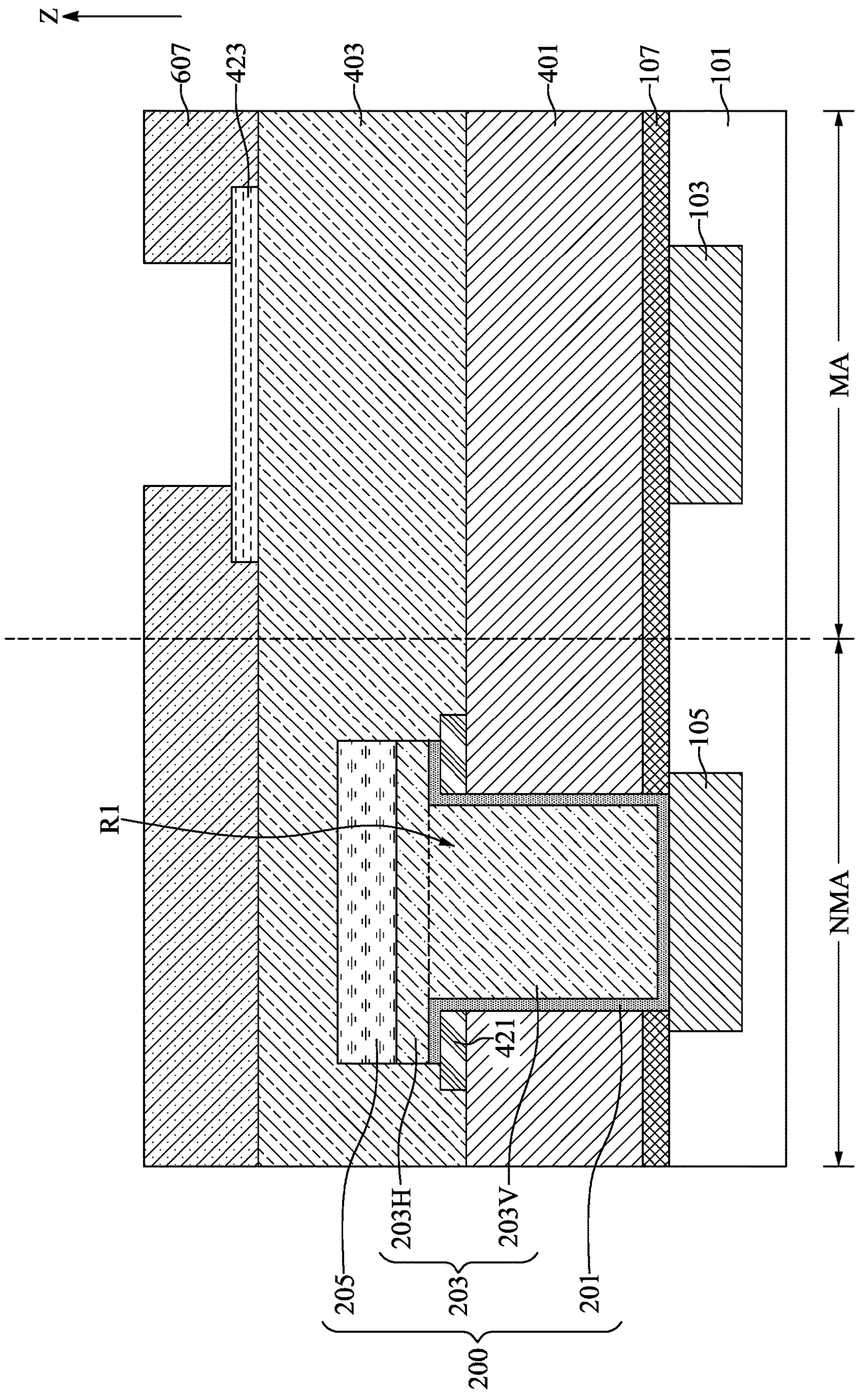

With reference to FIG. 16, a fourth mask layer 607 may be formed on the top energy-removable layer 403 and may cover a portion of the top barrier layer 423. The fourth mask layer 607 may include a pattern of a mixing-area recess R2, which is described below. The pattern of the fourth mask layer 607 may be formed using a procedure similar to that of the third mask layer 605, and descriptions thereof are not repeated herein.

Figure 17:
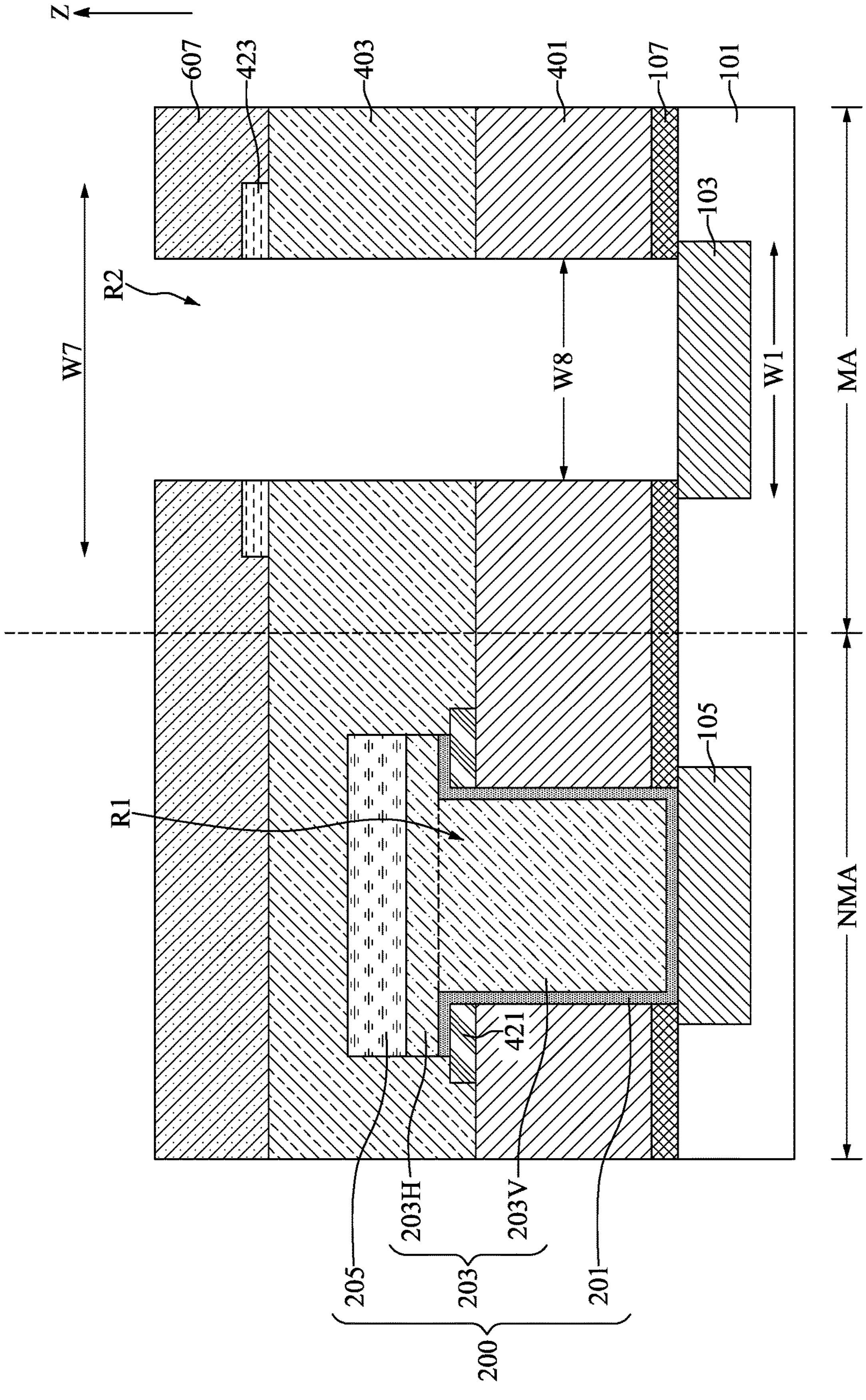

With reference to FIG. 17, a second recess etching process may be performed to remove portions of the top barrier layer 423, the top energy-removable layer 403, the bottom energy-removable layer 401, and the bottom dielectric layer 107. In some embodiments, the second recess etching process may be a multi-stage etching process. For example, the second recess etching process may be a three-stage anisotropic dry etching process. The etching chemistry may be different for each stage to provide different etching selectivities.

In some embodiments, during the first stage of the second recess etching process, a ratio of an etch rate of the top barrier layer 423 to an etch rate of the top energy-removable layer 403 may be between about 100:1 and about 1.05:1, between about 15:1 and about 2:1, or between about 10:1 and about 2:1. In some embodiments, during the second stage of the second recess etching process, a ratio of the etch rate of the top energy-removable layer 403 (and the bottom energy-removable layer 401) to the etch rate of the bottom dielectric layer 107 may be between about 100:1 and about 1.05:1, between about 15:1 and about 2:1, or between about 10:1 and about 2:1. In some embodiments, during the third stage of the second recess etching process, a ratio of the etch rate of the bottom dielectric layer 107 to an etch rate of the first bottom conductive layer 103 may be between about 100:1 and about 1.05:1, between about 15:1 and about 2:1, or between about 10:1 and about 2:1.

With reference to FIG. 17, after the second recess etching process, the mixing-area recess R2 may be formed in the top barrier layer 423, the top energy-removable layer 403, the bottom energy-removable layer 401, and the bottom dielectric layer 107. The first bottom conductive layer 103 may be partially exposed through the mixing-area recess R2. In some embodiments, a width W8 of the mixing-area recess R2 may be less than the width W1 of the first bottom conductive layer 103 and the width W7 of the top barrier layer 423. After the formation of the mixing-area recess R2, the fourth mask layer 607 may be removed.

Figure 18:
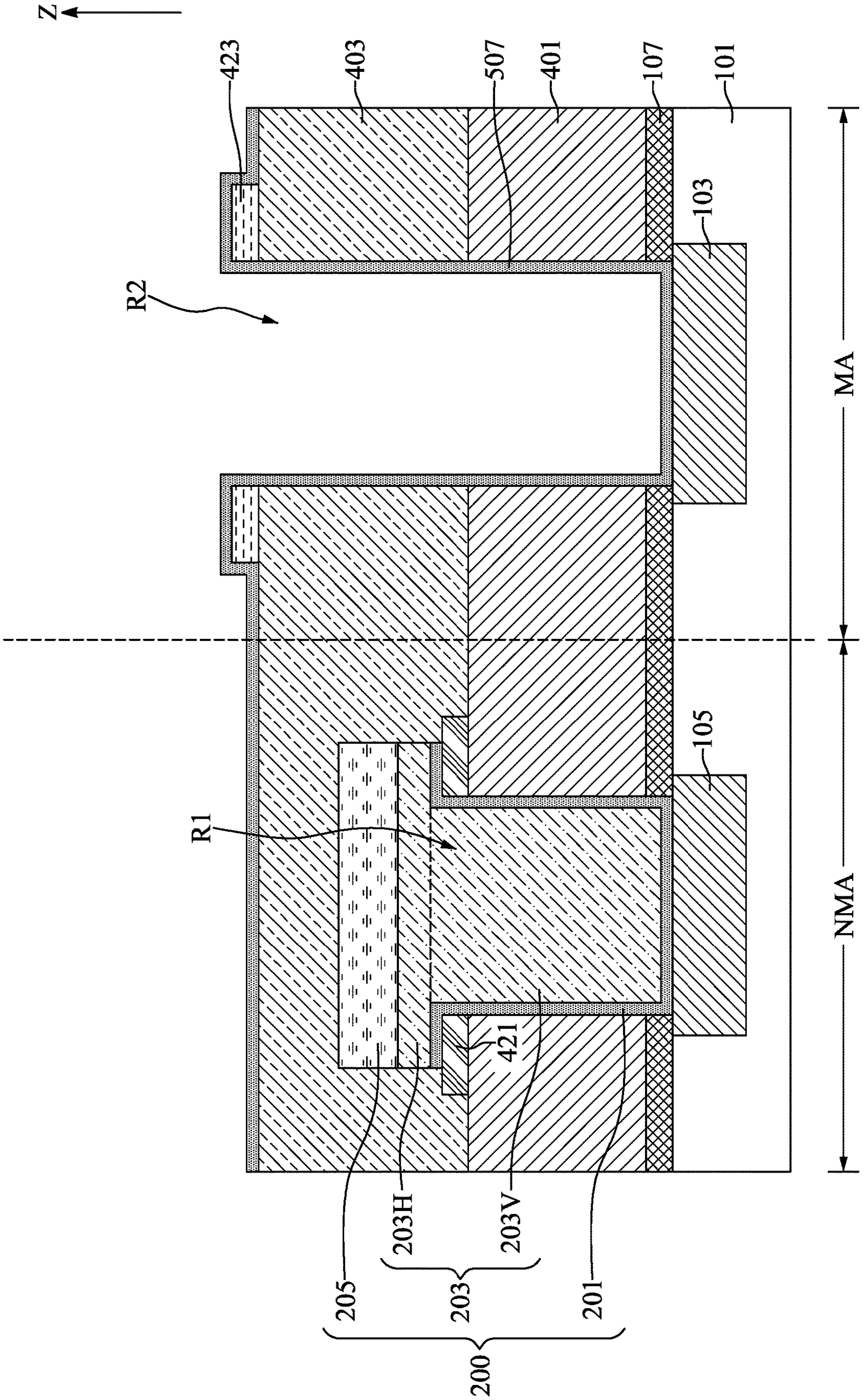

With reference to FIG. 18, a layer of second liner material 507 may be conformally formed on the top energy-removable layer 403, on the top barrier layer 423, on sidewalls of the mixing-area recess R2, and on the first bottom conductive layer 103. In some embodiments, the second liner material 507 may include, for example, titanium, titanium nitride, tantalum, tantalum nitride, or a combination thereof. In some embodiments, the second liner material 507 may be formed by, for example, chemical vapor deposition, atomic layer deposition, plasma-enhanced chemical vapor deposition, or other applicable deposition processes.

In some embodiments, the second liner material 507 may be the same material as the first liner material 505. The formation of the layer of second liner material 507 may be similar to the formation of the layer of first liner material 505, which is illustrated in FIG. 9, and descriptions thereof are not repeated herein.

Figure 19:
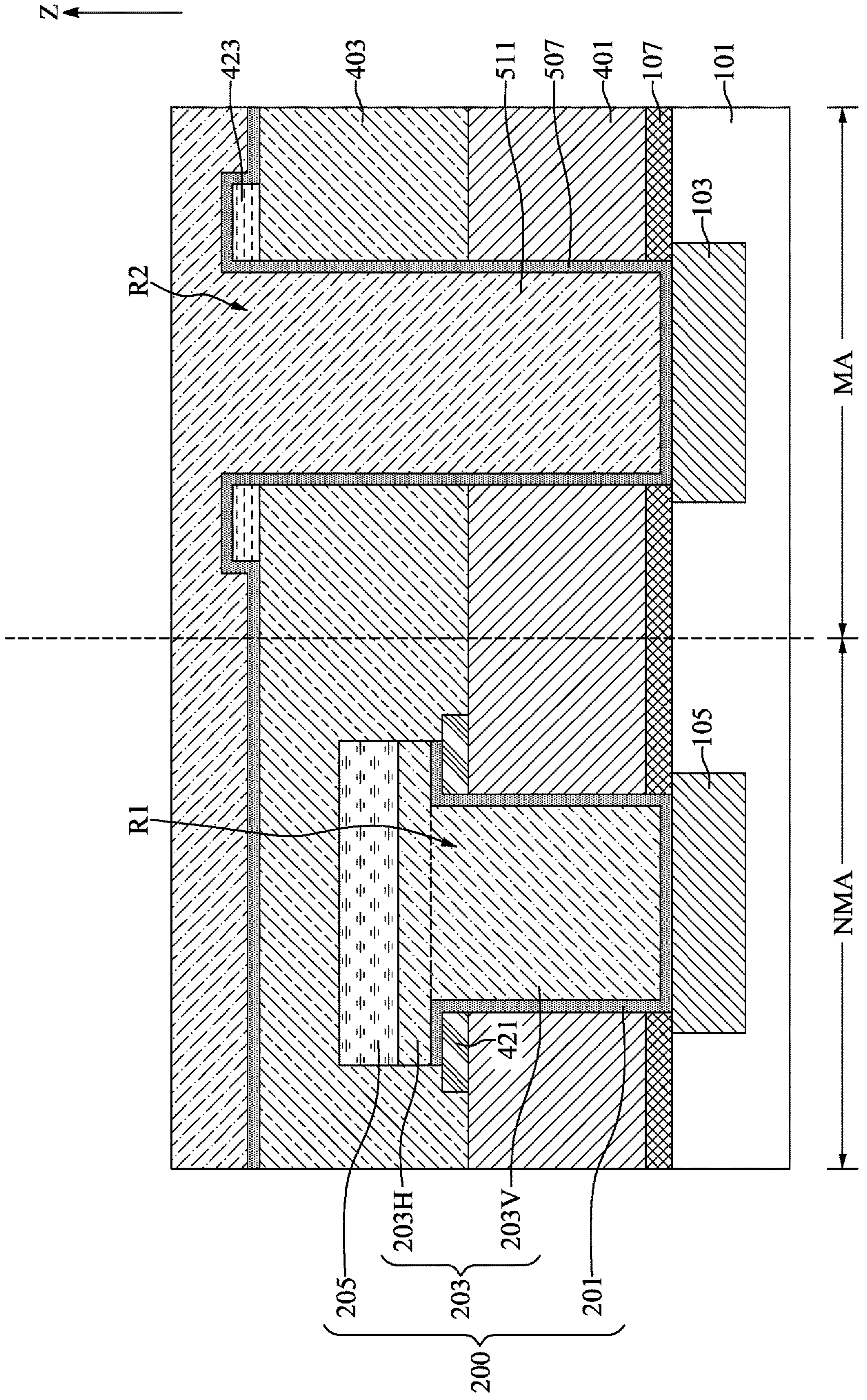

With reference to FIG. 19, a layer of second conductive material 511 may be formed on the layer of second liner material 507 and may completely fill the mixing-area recess R2. In some embodiments, the second conductive material 511 may include aluminum, copper, tungsten, or a combination thereof. In some embodiments, the layer of second conductive material 511 may be formed by, for example, physical vapor deposition, sputtering, electroplating, electroless plating, chemical vapor deposition, or other applicable deposition processes.

In some embodiments, a planarization process, such as chemical mechanical polishing, may be performed on the layer of second conductive material 511 to provide a substantially flat surface for subsequent processing steps.

Figure 20:
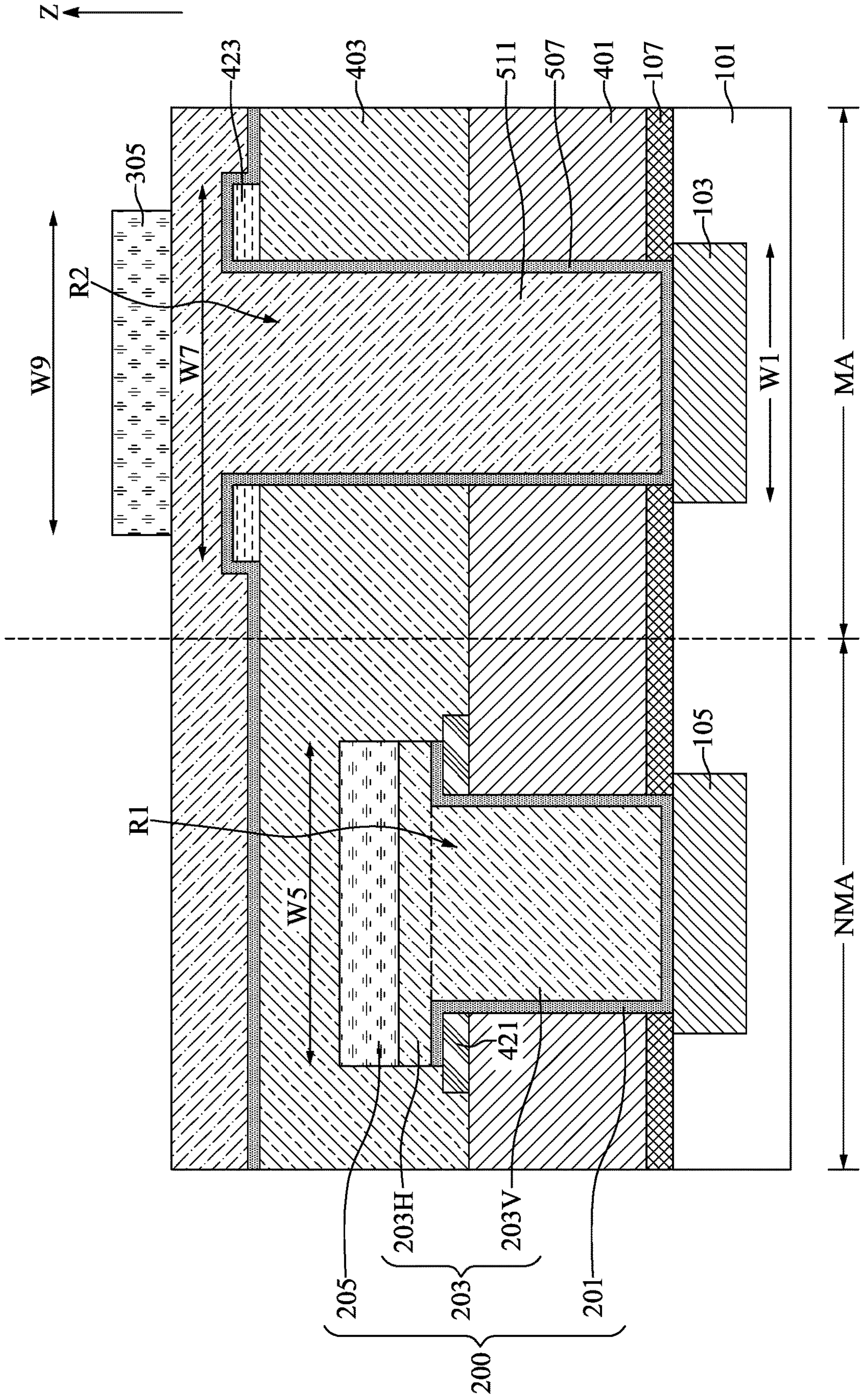

With reference to FIG. 20, a mixing-area hard mask layer 305 may be formed on the layer of second conductive material 511 and formed above the top barrier layer 423. In some embodiments, a width W9 of the mixing-area hard mask layer 305 may be less than the width W7 of the top barrier layer 423. In some embodiments, the width W9 of the mixing-area hard mask layer 305 may be greater than the width W1 of the first bottom conductive layer 103. In some embodiments, the width W9 of the mixing-area hard mask layer 305 and the width W1 of the first bottom conductive layer 103 may be substantially the same. In some embodiments, the width W9 of the mixing-area hard mask layer 305 and the width W5 of the non-mixing-area hard mask layer 205 may be substantially the same. In some embodiments, the width W9 of the mixing-area hard mask layer 305 and the width W5 of the non-mixing-area hard mask layer 205 may be different.

In some embodiments, the mixing-area hard mask layer 305 may be formed of, for example, a material having etching selectivity to the second conductive material 511, the second liner material 507, and a material of the top barrier layer 423. In some embodiments, the mixing-area hard mask layer 305 may be formed of, for example, silicon, silicon germanium, tetraethyl orthosilicate, silicon nitride, silicon oxynitride, silicon nitride oxide, silicon carbide, the like, or a combination thereof. In some embodiments, the mixing-area hard mask layer 305 may be formed of, for example, boron nitride, silicon boron nitride, phosphorus boron nitride, boron carbon silicon nitride, or the like. The mixing-area hard mask layer 305 may be formed using a procedure similar to that of the non-mixing-area hard mask layer 205, which is illustrated in FIG. 11, and descriptions thereof are not repeated herein.

Figure 21:
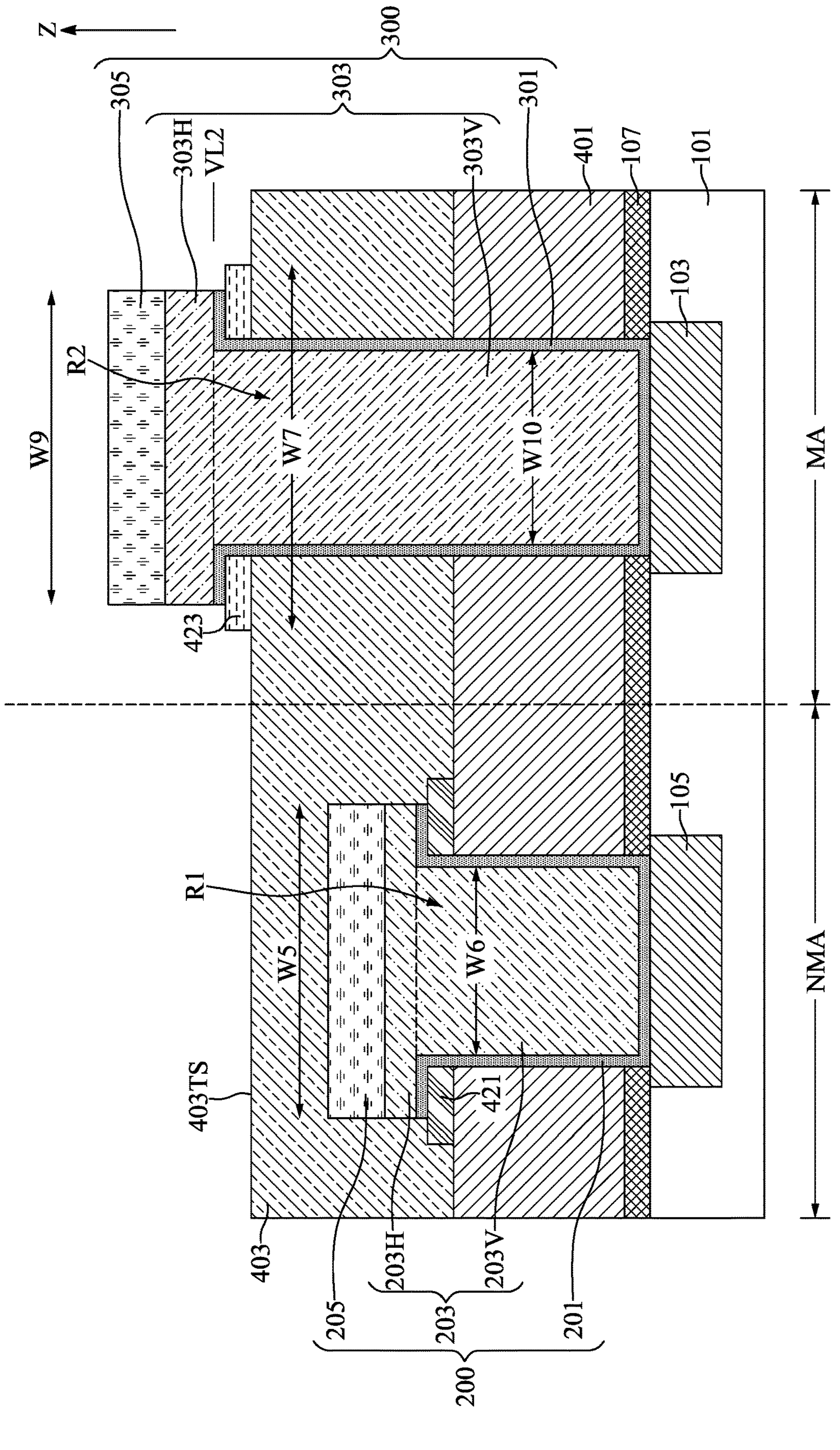

With reference to FIG. 21, a second etching process may be performed using the mixing-area hard mask layer 305 as a mask to remove portions of the second conductive material 511 and the second liner material 507. In some embodiments, the second etching process may be a multi-stage etching process. For example, the second etching process may be a two-stage anisotropic dry etching process. The etching chemistry may be different for each stage to provide different etching selectivities. In some embodiments, during the first stage of the second etching process, a ratio of an etch rate of the second conductive material 511 to an etch rate of the mixing-area hard mask layer 305 may be between about 100:1 and about 1.05:1, between about 15:1 and about 5:1, or between about 10:1 and about 3:1. In some embodiments, during the first stage of the second etching process, a ratio of the etch rate of the second conductive material 511 to an etch rate of the second liner material 507 may be between about 100:1 and about 1.05:1, between about 15:1 and about 5:1, or between about 10:1 and about 3:1.

In some embodiments, during the second stage of the second etching process, a ratio of the etch rate of the second liner material 507 to the etch rate of the mixing-area hard mask layer 305 may be between about 100:1 and about 1.05:1, between about 15:1 and about 5:1, or between about 10:1 and about 3:1. In some embodiments, during the second stage of the second etching process, a ratio of the etch rate of the second liner material 507 to the etch rate of the top barrier layer 423 may be between about 100:1 and about 1.05:1, between about 15:1 and about 5:1, or between about 10:1 and about 3:1. In some embodiments, during the second stage of the second etching process, a ratio of the etch rate of the second liner material 507 to the etch rate of the top energy-removable layer 403 may be between about 100:1 and about 1.05:1, between about 15:1 and about 5:1, or between about 10:1 and about 3:1.

With reference to FIG. 21, after the second etching process, the remaining second conductive material 511 may be referred to as the mixing-area conductive layer 303. The remaining second liner material 507 may be referred to as the mixing-area liner layer 301. The mixing-area liner layer 301, the mixing-area conductive layer 303, and the mixing-area hard mask layer 305 together comprise the mixing-area conductive structure 300. The mixing-area conductive structure 300 may be formed on the first bottom conductive layer 103 and on the mixing area MA.

With reference to FIG. 21, the mixing-area conductive layer 303 may include a vertical portion 303V and a horizontal portion 303H. The vertical portion 303V may be disposed on the first bottom conductive layer 103 and in the mixing-area recess R2. A top part of the vertical portion 303V may protrude from the top surface 403TS of the top energy-removable layer 403 and may be surrounded by the top barrier layer 423. In other words, a top surface of the vertical portion 303V may be at a vertical level VL2 higher than the top surface 403TS of the top energy-removable layer 403. A bottom part of the vertical portion 303V may be surrounded by the bottom dielectric layer 107. In some embodiments, a width W10 of the vertical portion 303V may be less than the width W9 of the mixing-area hard mask layer 305. In some embodiments, the width W10 of the vertical portion 303V and the width W6 of the vertical portion 203V may be substantially the same. In some embodiments, the width W10 of the vertical portion 303V and the width W6 of the vertical portion 203V may be different.

With reference to FIG. 21, the horizontal portion 303H may be disposed on the vertical portion 303V and on the top barrier layer 423. In some embodiments, the horizontal portion 303H may have the same width W9 as the mixing-area hard mask layer 305. In some embodiments, the width W9 of the horizontal portion 303H may be greater than the width W10 of the vertical portion 303V. That is, the mixing-area conductive layer 303 may have a T-shaped cross-sectional profile. In some embodiments, the width W9 of the horizontal portion 303H may be less than the width W7 of the top barrier layer 423. In some embodiments, the width W9 of the horizontal portion 303H and the width W5 of the horizontal portion 203H may be substantially the same. In some embodiments, the width W9 of the horizontal portion 303H and the width W5 of the horizontal portion 203H may be different.

With reference to FIG. 21, the mixing-area liner layer 301 may be conformally disposed between the mixing-area conductive layer 303 and the bottom energy-removable layer 401, between the mixing-area conductive layer 303 and the top energy-removable layer 403, between the mixing-area conductive layer 303 and the top barrier layer 423, between the mixing-area conductive layer 303 and the bottom dielectric layer 107, and between the mixing-area conductive layer 303 and the first bottom conductive layer 103.

The mixing-area liner layer 301 may be conformally disposed between the horizontal portion 303H and the top barrier layer 423, between the vertical portion 303V and the top barrier layer 423, between the vertical portion 303V and the top energy-removable layer 403, between the vertical portion 303V and the bottom energy-removable layer 401, between the vertical portion 303V and the bottom dielectric layer 107, and between the vertical portion 303V and the first bottom conductive layer 103. The mixing-area liner layer 301 may improve adhesion between the mixing-area conductive layer 303 and the top barrier layer 423, between the mixing-area conductive layer 303 and the top energy-removable layer 403, between the mixing-area conductive layer 303 and the bottom energy-removable layer 401, between the mixing-area conductive layer 303 and the bottom dielectric layer 107, and between the mixing-area conductive layer 303 and the first bottom conductive layer 103. The mixing-area liner layer 301 may also prevent metal ion diffusion from the mixing-area conductive layer 303 to the bottom energy-removable layer 401, the top energy-removable layer 403, or the substrate 101.

Figure 22:
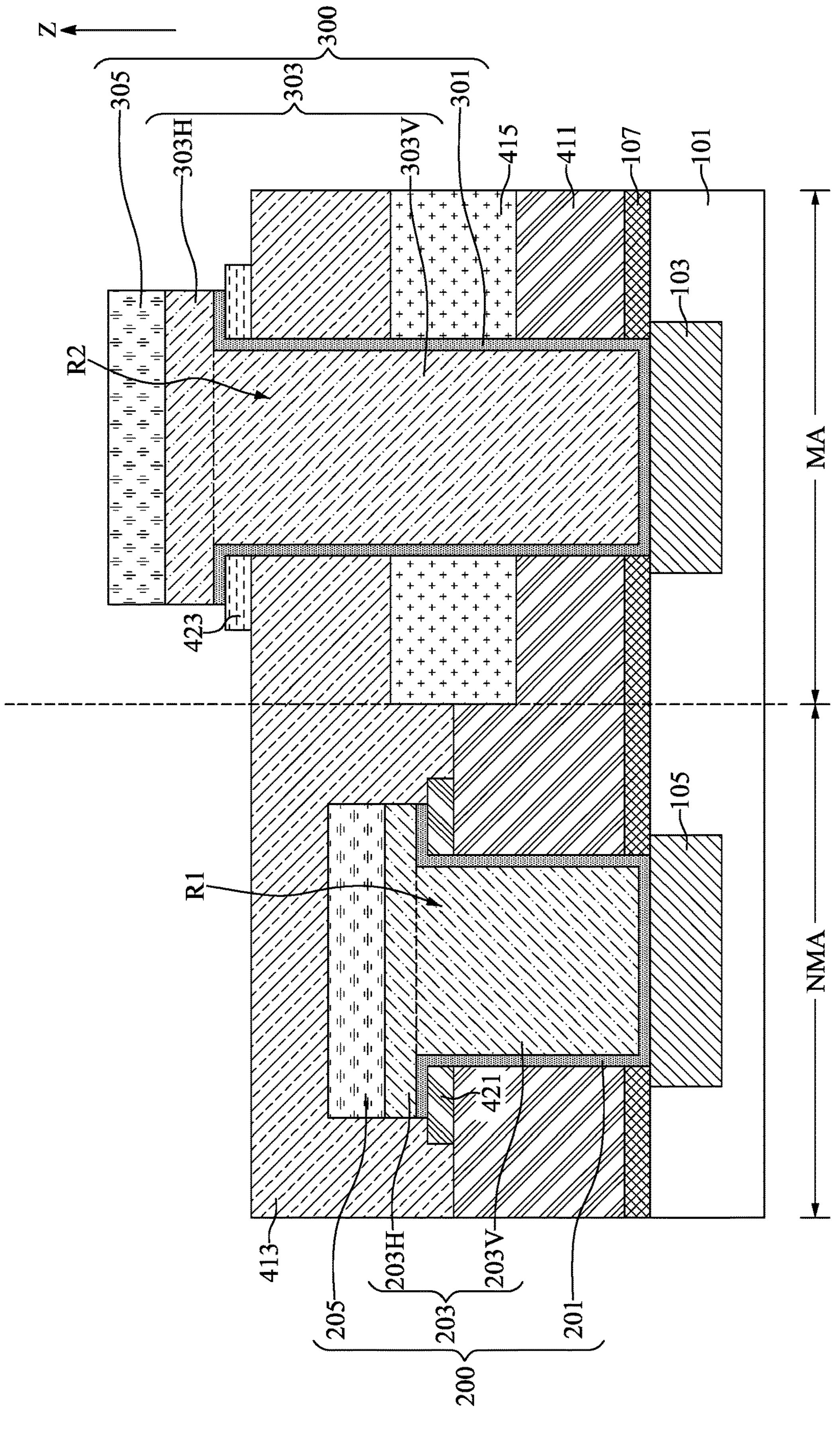
Figure 23:
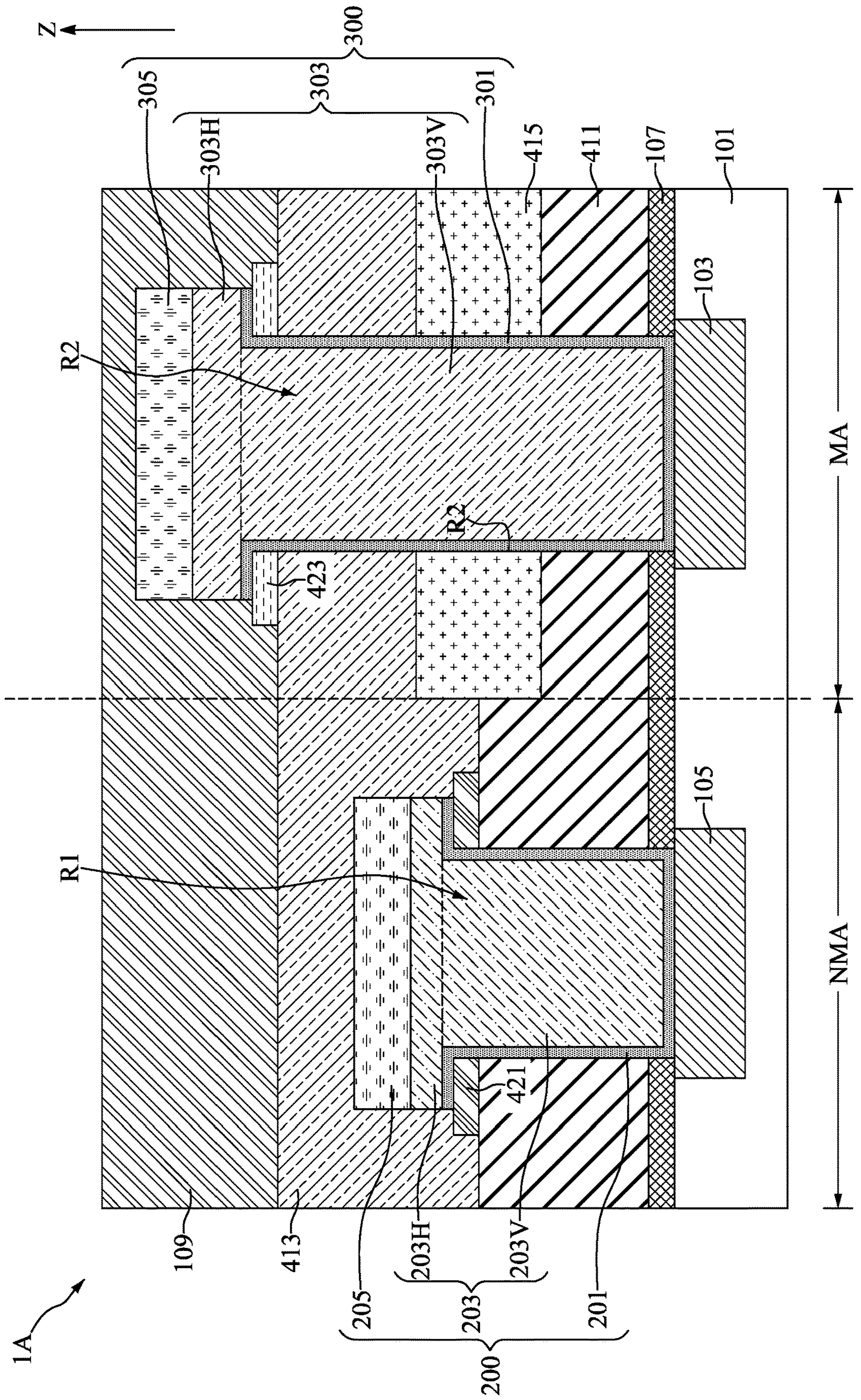

With reference to FIGS. 1, 22, and 23, in step S17, an energy treatment may be performed to turn the bottom energy-removable layer 401 into a bottom porous dielectric layer 411, turn the top energy-removable layer 403 into a top porous dielectric layer 413, form a middle porous dielectric layer 415 over the mixing area MA of the substrate 101 and between the bottom porous dielectric layer 411 and the top porous dielectric layer 413, and form a top dielectric layer 109 on the top porous dielectric layer 413.

With reference to FIG. 22, the energy treatment may be performed on the intermediate semiconductor device in FIG. 21 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the bottom energy-removable layer 401 and the top energy-removable layer 403 to generate empty spaces (pores), with the base material remaining in place. The empty spaces may be filled with air so that a dielectric constant of the resulting layers containing the empty spaces may be significantly low.

After the energy treatment, the bottom energy-removable layer 401 may be turned into the bottom porous dielectric layer 411. The bottom porous dielectric layer 411 may be disposed on the bottom dielectric layer 107 and above the non-mixing area NMA and the mixing area MA of the substrate 101. The top energy-removable layer 403 may be turned into the top porous dielectric layer 413. The top porous dielectric layer 413 may be disposed on the bottom porous dielectric layer 411 and above the non-mixing area NMA and the mixing area MA of the substrate 101. In some embodiments, a porosity of the top porous dielectric layer 413 may be greater than a porosity of the bottom porous dielectric layer 411.

In some embodiments, above the mixing area MA, because no barrier layer is present between the bottom energy-removable layer 401 and the top energy-removable layer 403, the bottom energy-removable layer 401 and the top energy-removable layer 403 may mix at an interface between the two energy-removable layers 401 and 403. As a result, after the energy treatment, the middle porous dielectric layer 415 may be formed between the bottom porous dielectric layer 411 and the top porous dielectric layer 413 and only above the mixing area MA. In some embodiments, a porosity of the middle porous dielectric layer 415 may be less than the porosity of the top porous dielectric layer 413 and may be greater than the porosity of the bottom porous dielectric layer 411. In some embodiments, an interface between the top porous dielectric layer 413 and the middle porous dielectric layer 415 may be vague. In some embodiments, an interface between the middle porous dielectric layer 415 and the bottom porous dielectric layer 411 may be vague.

In some embodiments, at positions of decreasing distance above the substrate 101, the porosity of the middle porous dielectric layer 415 may gradually decrease. In some embodiments, the porosity of the bottom dielectric layer 107 may be less than the porosity of the bottom porous dielectric layer 411, the porosity of the middle porous dielectric layer 415, or the porosity of the top porous dielectric layer 413.

With reference to FIG. 23, the top dielectric layer 109 may be formed on the top porous dielectric layer 413 and covers the mixing-area conductive structure 300 and the top barrier layer 423. In some embodiments, the top dielectric layer 109 may be formed of, for example, silicon dioxide, undoped silicate glass, fluorosilicate glass, borophosphosilicate glass, a spin-on low-k dielectric material, a chemical vapor deposition low-k dielectric material, or a combination thereof. The term "low-k" as used throughout the present application denotes a dielectric material that has a dielectric constant less than that of silicon dioxide. In some embodiments, the top dielectric layer 109 may include a self-planarizing material such as a spin-on glass or a spin-on low-k dielectric material such as SiLK™. The use of a self-planarizing dielectric material may prevent the need to perform a subsequent planarizing step. In some embodiments, the top dielectric layer 109 may be formed by a deposition process including, for example, chemical vapor deposition, plasma-enhanced chemical vapor deposition, evaporation, or spin coating.

Due to the inclusion of the bottom porous dielectric layer 411, the top porous dielectric layer 413, and the middle porous dielectric layer 415 having low dielectric constants, parasitic capacitance of the semiconductor device 1A may be reduced. As a result, performance of the semiconductor device 1A may be improved. In addition, the bottom barrier layer 421 or the top barrier layer 423 may prevent an outgassing issue of the porous layers (i.e., the bottom porous dielectric layer 411, the top porous dielectric layer 413, and the middle porous dielectric layer 415), thereby preventing damage to the conductive structures (i.e., the mixing-area conductive structure 300 and the non-mixing-area conductive structure 200) and improving reliability of the semiconductor device 1A. Furthermore, the bottom barrier layer 421 and the top barrier layer 423 may also serve as etch-stop layers during the formation of the conductive structures, thereby preventing damage to the bottom energy-removable layer 401 and the top energy-removable layer 403 during the formation of the conductive structures.

Figure 24:
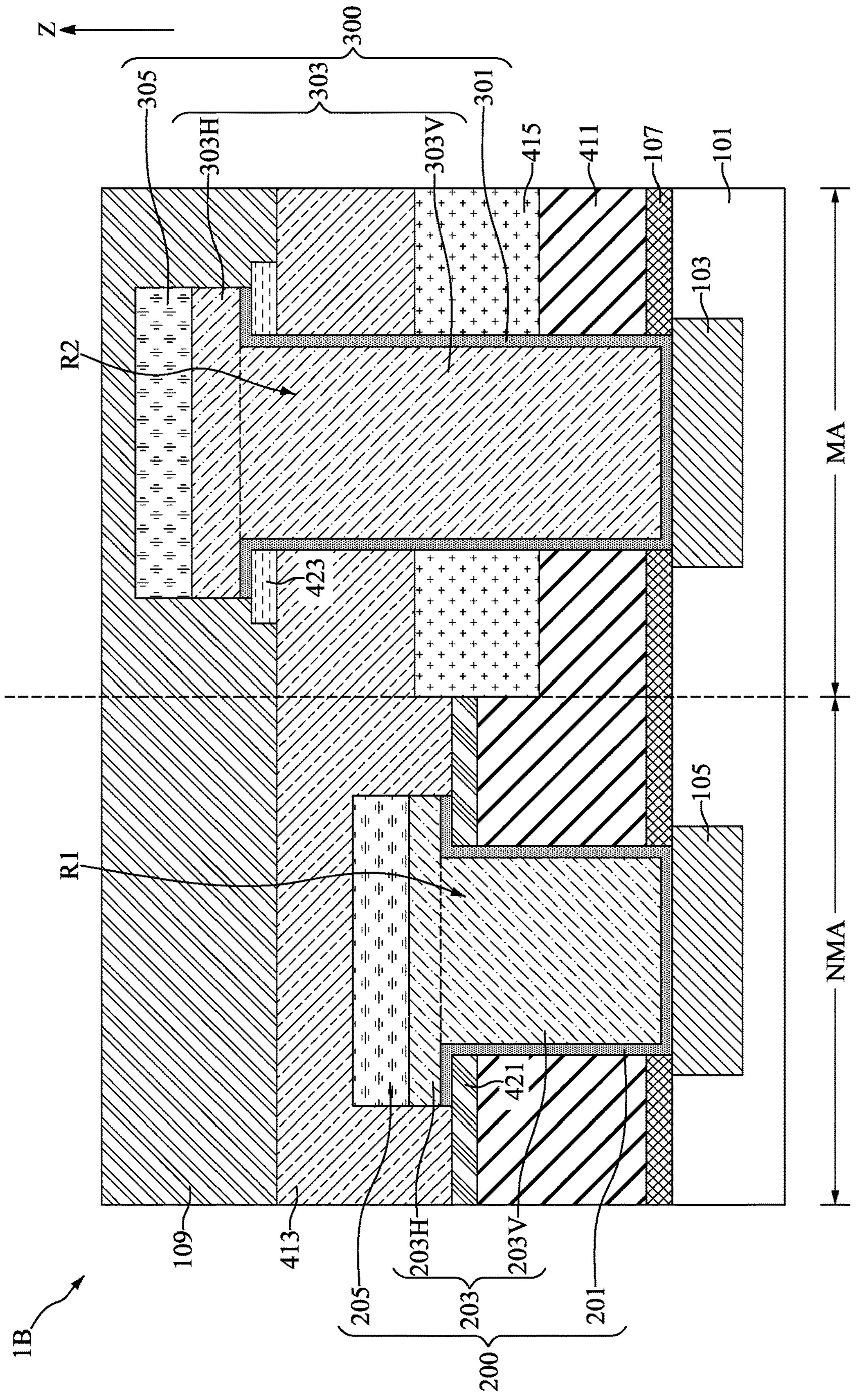
FIGS. 24 to 26 illustrate, in schematic cross-sectional view diagrams, semiconductor devices in accordance with some embodiments of the present disclosure.
Figure 25:
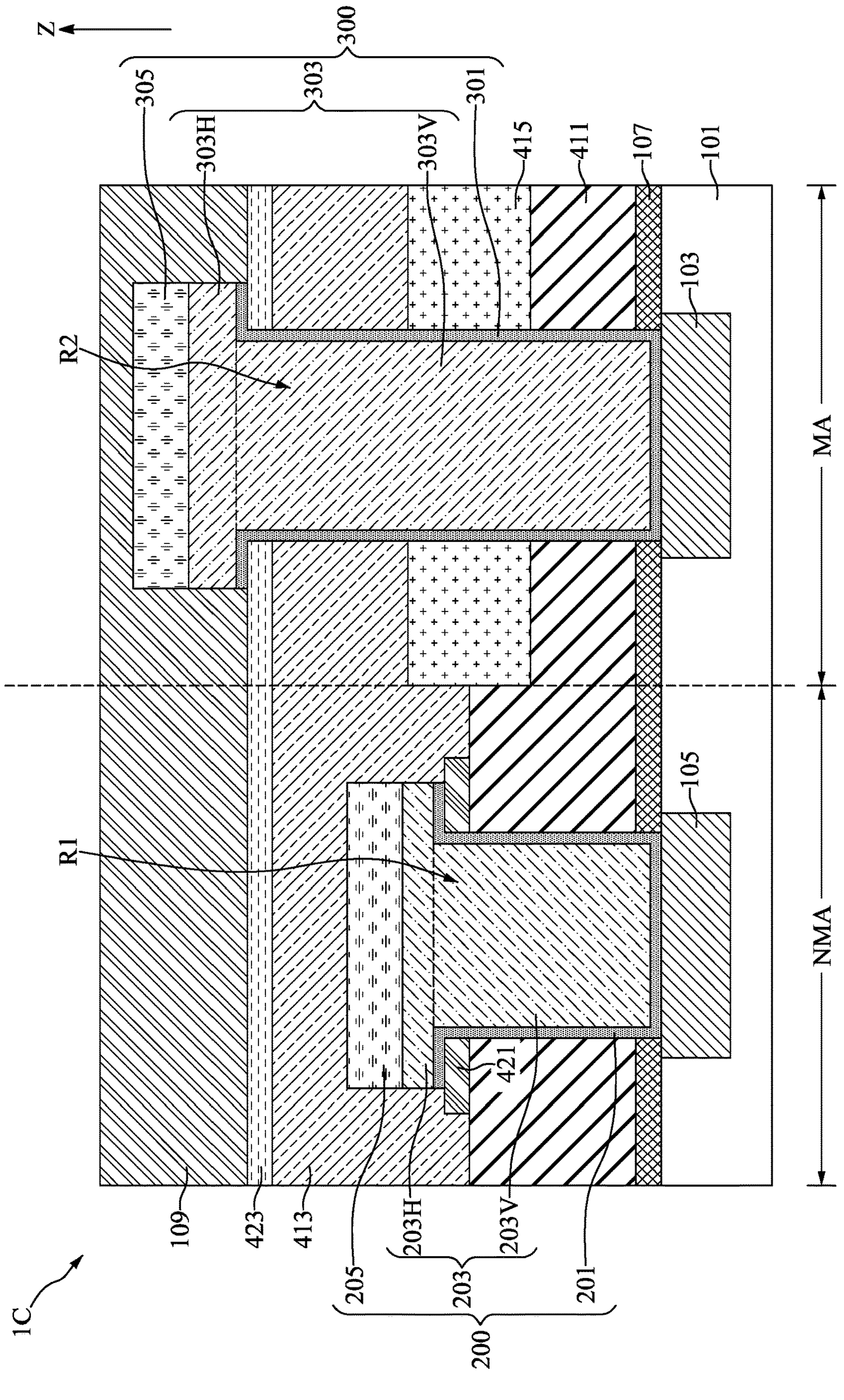
Figure 26:
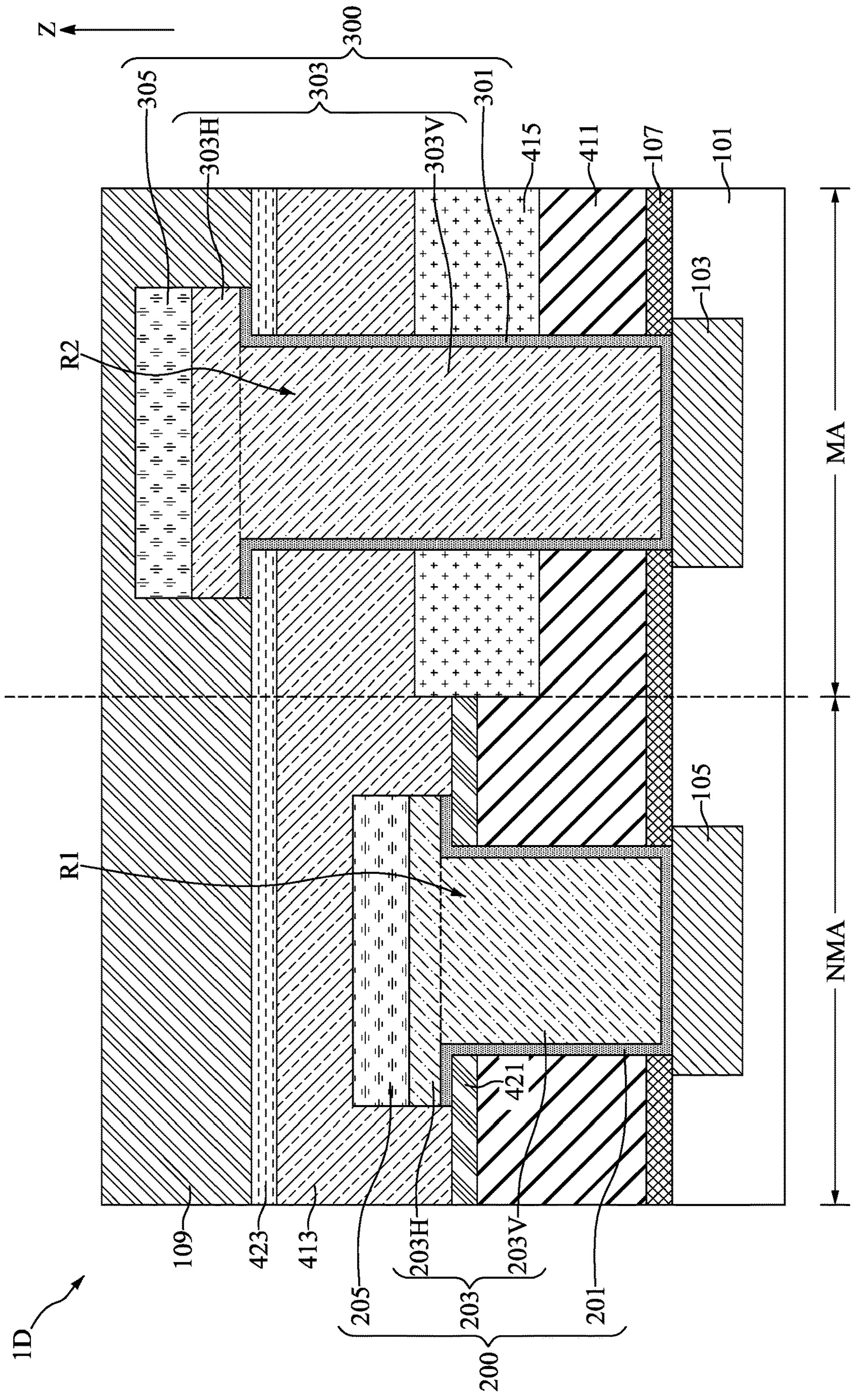

FIGS. 24 to 26 illustrate, in schematic cross-sectional view diagrams, semiconductor devices 1B, 1C, and 1D in accordance with some embodiments of the present disclosure.

With reference to FIGS. 24 to 26, each of the semiconductor devices 1B, 1C, and 1D may have a structure similar to that illustrated in FIG. 23. Elements in FIGS. 24 to 26 that are the same as or similar to those in FIG. 23 are labeled with similar reference numbers and repeated descriptions are omitted.

With reference to FIG. 24, in the semiconductor device 1B, the bottom barrier layer 421 may be disposed between the bottom porous dielectric layer 411 and the top porous dielectric layer 413 and may completely separate the bottom porous dielectric layer 411 from the top porous dielectric layer 413 above the non-mixing area NMA of the substrate 101.

With reference to FIG. 25, in the semiconductor device 1C, the top barrier layer 423 may completely separate the top dielectric layer 109 from the top porous dielectric layer 413 above the non-mixing area NMA and the mixing area MA of the substrate 101. In this regard, the top barrier layer 423 may be referred to as the capping layer 423 or the sealing layer 423.

With reference to FIG. 26, in the semiconductor device 1D, the bottom barrier layer 421 may be disposed between the bottom porous dielectric layer 411 and the top porous dielectric layer 413 and may completely separate the bottom porous dielectric layer 411 from the top porous dielectric layer 413 above the non-mixing area NMA of the substrate 101. The top barrier layer 423 may completely separate the top dielectric layer 109 from the top porous dielectric layer 413 above the non-mixing area NMA and the mixing area MA of the substrate 101.

Figure 27:
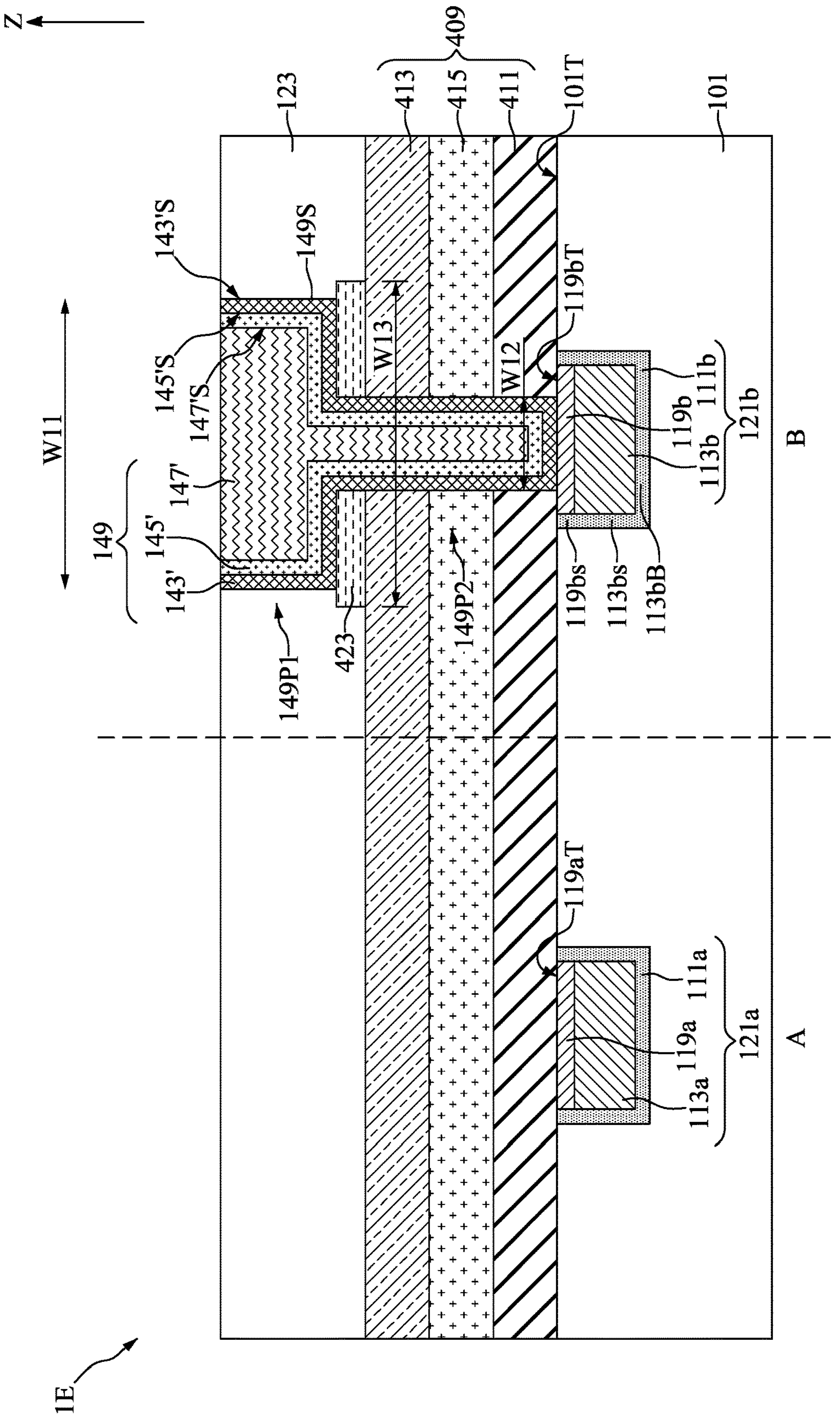
FIG. 27 illustrates, in a schematic cross-sectional view diagram, a semiconductor device in accordance with some embodiments of the present disclosure.

FIG. 27 illustrates, in a schematic cross-sectional view diagram, a semiconductor device 1E in accordance with some embodiments of the present disclosure. The semiconductor device 1E in FIG. 27 and the semiconductor structure in FIG. 23 are similar in many aspects, and thus descriptions of similar features are not repeated herein. Main differences are described below.

With reference to FIG. 27, in the semiconductor device 1E, a first interconnect structure 121*b* may be formed in a pattern-sparse region B, a second interconnect structure 149 may be formed on the first interconnect structure 121*b* and above the pattern-sparse region B, and a third interconnect structure 121*a* may be formed in a pattern-dense region A.

The first interconnect structure 121*b* and the third interconnect structure 121*a* (also referred to as lower interconnect structures) may be disposed in the semiconductor substrate 101. In some embodiments, details of the third interconnect structure 121*a* are similar to, or the same as, details of the first interconnect structure 121*b*, except that they are located in different regions.

Specifically, the third interconnect structure 121*a* may include a third barrier layer 111*a*, a third conductive line 113*a* disposed over the third barrier layer 111*a*, and a third manganese-containing layer 119*a* disposed over the third conductive line 113*a*. In some embodiments, the third barrier layer 111*a* covers sidewalls of the third conductive line 113*a* and sidewalls of the third manganese-containing layer 119*a*. In some embodiments, the third conductive line 113*a* and the third manganese-containing layer 119*a* are separated from the semiconductor substrate 101 by the third barrier layer 111*a*.

Similar to the third interconnect structure 121*a* of the pattern-dense region A, the first interconnect structure 121*b* of the pattern-sparse region B may include a first barrier layer 111*b*, a first conductive line 113*b* disposed over the first barrier layer 111*b*, and a first manganese-containing layer 119*b* disposed over the first conductive line 113*b*. In some embodiments, the first conductive line 113*b* in the pattern-sparse region B is parallel to the third conductive line 113*a* in the pattern-dense region A. Moreover, in some embodiments, the first barrier layer 111*b* covers sidewalls of the first conductive line 113*b* and sidewalls of the first manganese-containing layer 119*b*.

In some embodiments, the first conductive line 113*b* and the first manganese-containing layer 119*b* are separated from the semiconductor substrate 101 by the first barrier layer 111*b*. In addition, in accordance with some embodiments, a top surface 119*a*T of the third manganese-containing layer 119*a* and a top surface 119*b*T of the first manganese-containing layer 119*b* are substantially level with a top surface 101T of the semiconductor substrate 101.

Still referring to FIG. 27, the semiconductor device structure 1E may also include a bottom porous dielectric layer 411, a middle porous dielectric layer 415, a top porous dielectric layer 413, a dielectric layer 123, a top barrier layer 423 and the second interconnect structure 149.

The bottom porous dielectric layer 411 may be disposed on the pattern-sparse region B and the pattern-dense region A of the substrate 101, the middle porous dielectric layer 415 may be disposed on the bottom porous dielectric layer 411, the top porous dielectric layer 413 may be disposed on the middle porous dielectric layer 415, and the dielectric layer 123 may be disposed on the top porous dielectric layer 413. The bottom porous dielectric layer 411 may completely cover the pattern-dense region A of the substrate 101, the middle porous dielectric layer 415 may completely cover the bottom porous dielectric layer 411 over the pattern-dense region A of the substrate 101, the top porous dielectric layer 413 may completely cover the middle porous dielectric layer 415 over the pattern-dense region A of the substrate 101, and the dielectric layer 123 may completely cover the top porous dielectric layer 413 over the pattern-dense region A of the substrate 101. The formation, materials, and features of the bottom porous dielectric layer 411, the middle porous dielectric layer 415 and the top porous dielectric layer 413 are the same as those of the bottom porous dielectric layer 411, the middle porous dielectric layer 415 and the top porous dielectric layer 413 illustrated in FIG. 23, and thus descriptions of formation, material, and features are not repeated herein.

The second interconnect structure 149 (also referred to as an upper interconnect structure) may be formed on the pattern-sparse region B of the substrate 101 and on the first interconnect structure 121*b*, and is electrically connected to the first interconnect structure 121*b*. In some embodiments, the second interconnect structure 149 may be in direct contact with the first interconnect structure 121*b*.

Specifically, the second interconnect structure 149 may include a second barrier layer 143', a second manganese-containing layer 145' disposed over the second barrier layer 143', and a second conductive line 147' disposed over the second manganese-containing layer 145'. In some embodiments, the second conductive line 147' may be surrounded by the second manganese-containing layer 145', and the second manganese-containing layer 145' may be surrounded by the second barrier layer 143'. Specifically, sidewalls 147'S of the second conductive line 147' may be covered by the second manganese-containing layer 145', and sidewalls 145'S of the second manganese-containing layer 145' may be covered by the second barrier layer 143'.

In some embodiments, the second manganese-containing layer 145' may be sandwiched between the second barrier layer 143' and the second conductive line 147', and the second conductive line 147' may be separated from the second barrier layer 143' by the second manganese-containing layer 145'. In some embodiments, a portion of the second barrier layer 143' may be sandwiched between the second manganese-containing layer 145' of the second interconnect structure 149 and the manganese-containing layer 119*b* of the first interconnect structure 121*b*. In some embodiments, the second manganese-containing layer 145' may be separated from the dielectric layer 123 by the second barrier layer 143'.

Moreover, in accordance with some embodiments, a top surface of the second conductive line 147' is substantially level with a top surface of the second manganese-containing layer 145' and a top surface of the second barrier layer 143'. In some embodiments, a portion of the first manganese-containing layer 119*b* and a portion of the first barrier layer 111*b* of the first interconnect structure 121*b* are covered by the bottom porous dielectric layer 411. In some embodiments, a width W11 of a top portion 149P1 of the second interconnect structure 149 may be greater than a width W12 of a bottom portion 149P2 of the second interconnect structure 149, and the second interconnect structure 149 may have a T-shaped cross-sectional profile. In some embodiments, the top portion 149P1 of the second interconnect structure 149 may be surrounded by the dielectric layer 123 over the pattern-sparse region B of the substrate 101, and the bottom portion 149P2 of the second interconnect structure 149 may be surrounded by the bottom porous dielectric layer 411, the middle porous dielectric layer 415 and the top porous dielectric layer 413 over the pattern-sparse region B of the substrate 101. It should be noted that, in accordance with some embodiments, the third interconnect structure 121*a* of the pattern-dense region A is entirely covered by the bottom porous dielectric layer 411.

In some embodiments, the first manganese-containing layer 119*b*, the third manganese-containing layer 119*a*, and the second manganese-containing layer 145' are made of manganese (Mn). In some embodiments, the first conductive line 113*b*, the third conductive line 113*a*, and the second conductive line 147' are made of copper (Cu). In some embodiments, the first barrier layer 111*b*, the third barrier layer 111*a*, and the second barrier layer 143' are made of tantalum (Ta), tantalum nitride (TaN), titanium (Ti), titanium nitride (TiN), a combination thereof, or another applicable material. In some embodiments, the manganese atomic percentage of the first interconnect structure 121*b* may be substantially the same as the manganese atomic percentage of the third interconnect structure 121*a*, and the manganese atomic percentage of the first interconnect structure 121*b* may be different from the manganese atomic percentage of the second interconnect structure 149. In some embodiments, the manganese atomic percentage of the first interconnect structure 121*b* is greater than the manganese atomic percentage of the second interconnect structure 149.

In some embodiments, the top barrier layer 423 may be disposed between the second barrier layer 143' and the top porous dielectric layer 413, and the top barrier layer 423 may be surrounded by the dielectric layer 123 over the pattern-sparse region B of the substrate 101. In some embodiments, a width W13 of the top barrier layer 423 may be less than the width W11 of the top portion 149P1 of the second interconnect structure 149.

Figure 28:
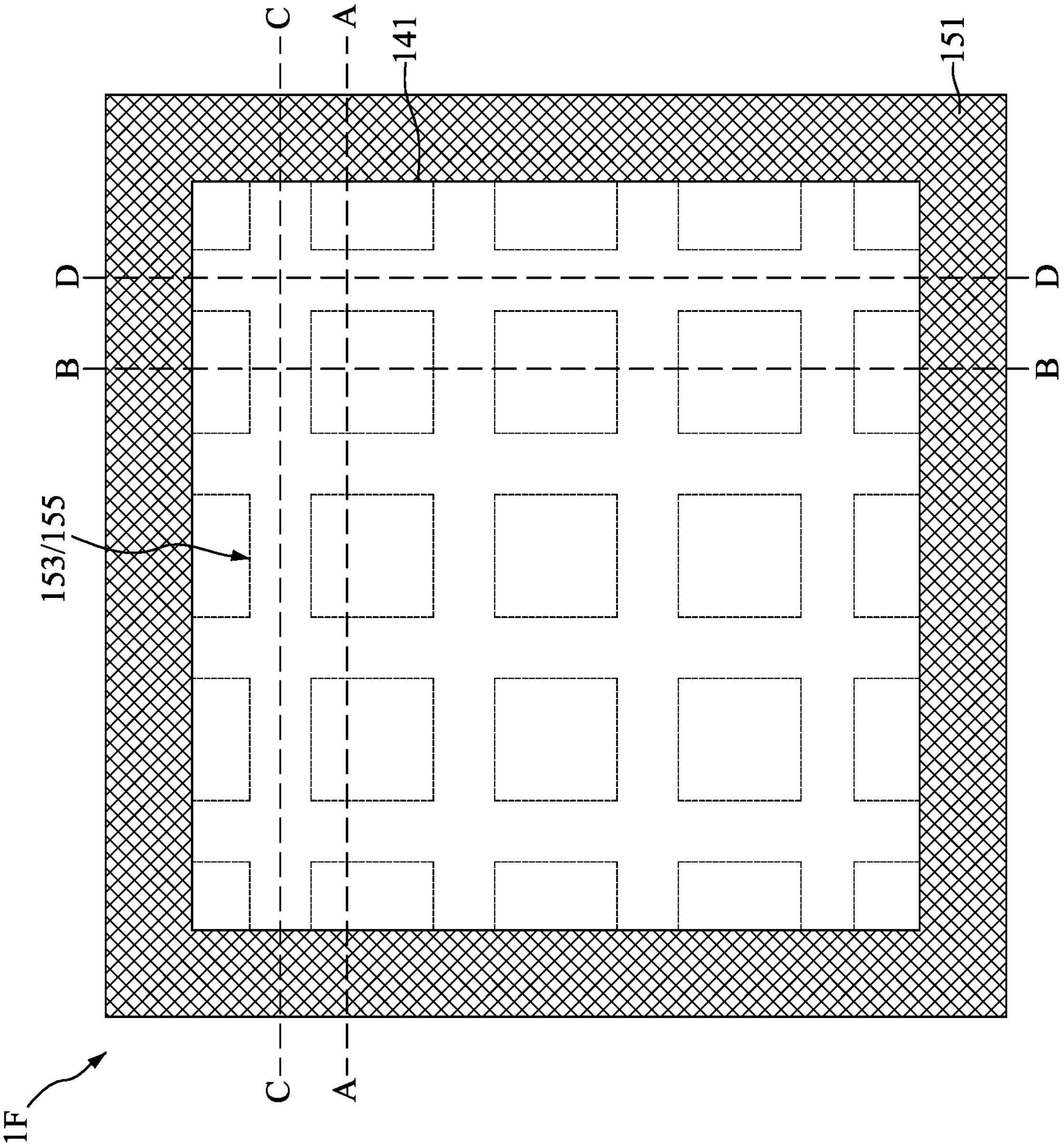
FIG. 28 illustrates, in a schematic top-view diagram, a semiconductor device in accordance with some embodiments of the present disclosure.
Figure 29:
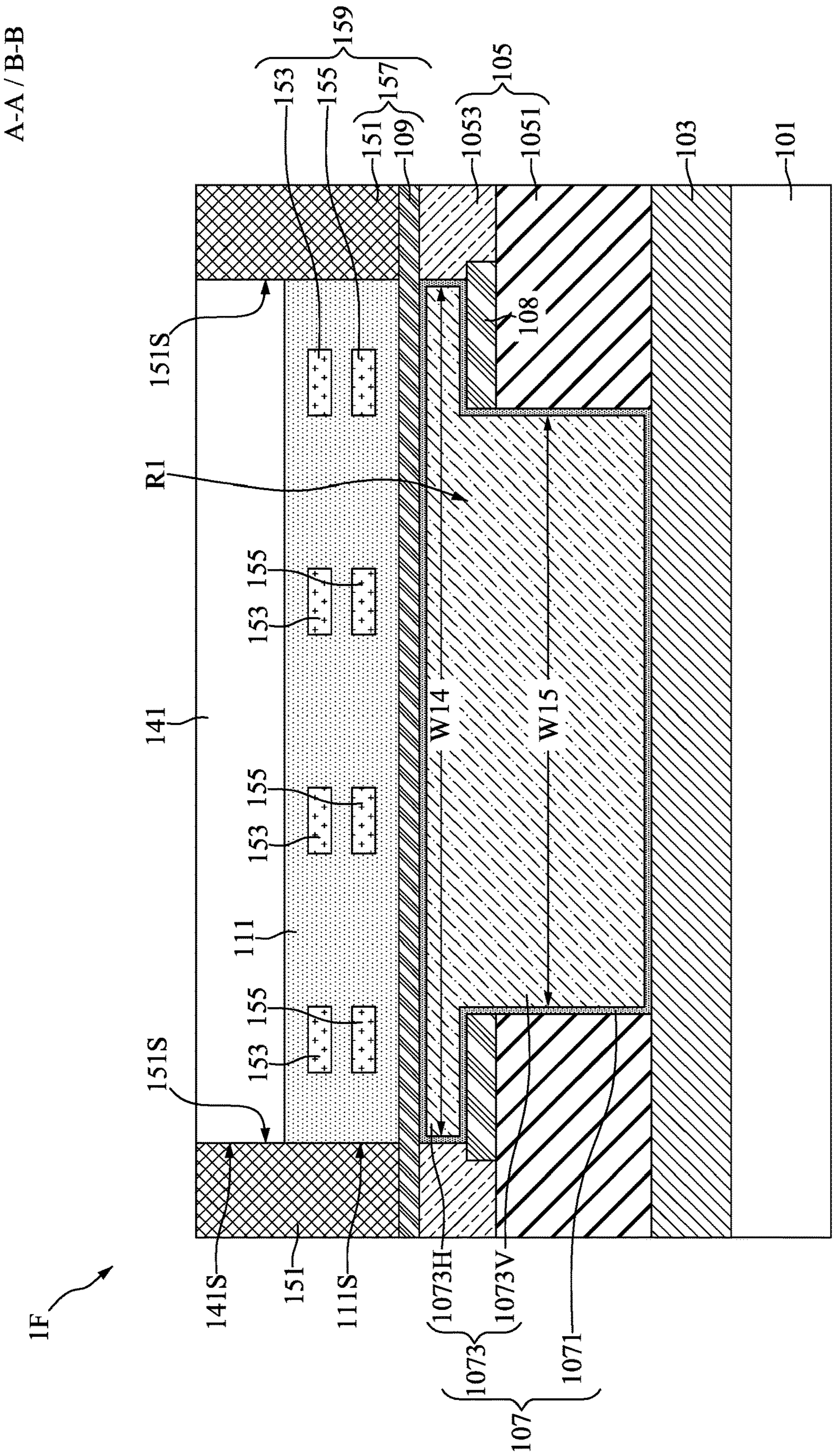
FIGS. 29 and 30 illustrate, in schematic cross-sectional view diagrams, the semiconductor device illustrated in FIG. 28 in accordance with some embodiments of the present disclosure.
Figure 30:
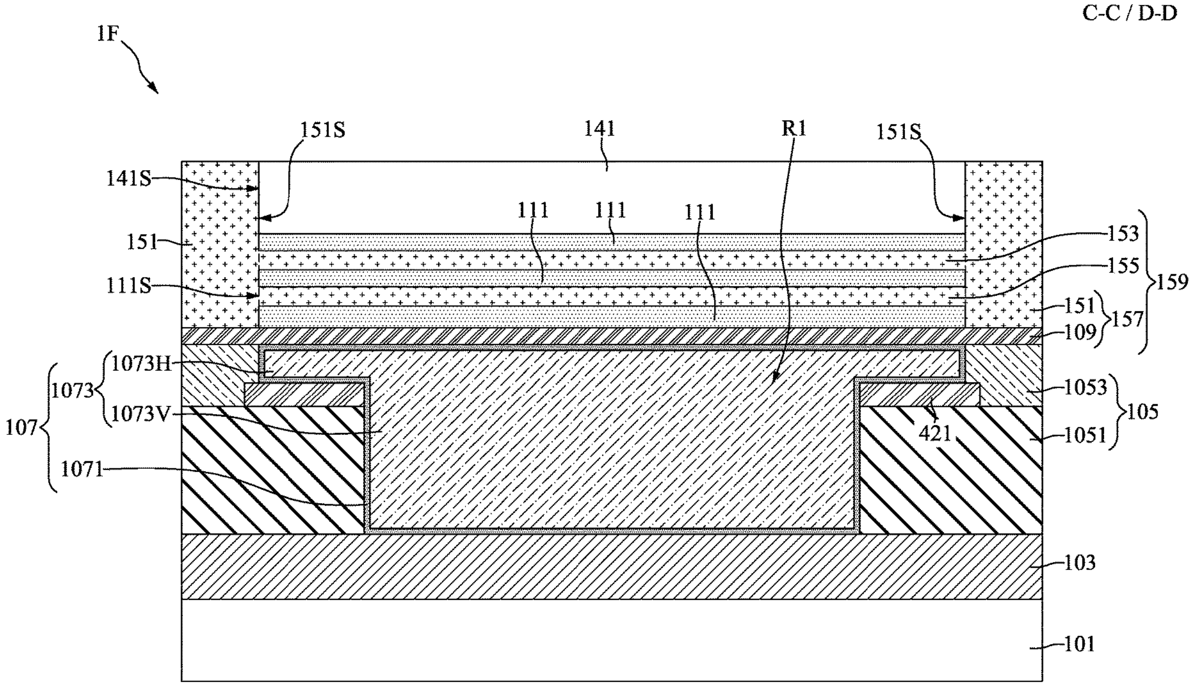

FIGS. 28 to 30 illustrate schematic diagrams of a semiconductor device 1F in accordance with some embodiments of the present disclosure. FIG. 28 is a top-view diagram. FIG. 29 is a cross-sectional view along sectional lines A-A or B-B of FIG. 28. FIG. 30 is a cross-sectional view along sectional lines C-C or D-D of FIG. 28.

With reference to FIGS. 28 to 30, the semiconductor device 1F includes a semiconductor substrate 101, a source/drain region 103, a dielectric layer 105, a capacitor contact 107, a bottom barrier layer 108, a dielectric layer 111, a patterned mask 141, and a bottom capacitor electrode 159.

The semiconductor substrate 101 may be a semiconductor wafer such as a silicon wafer. Alternatively, or additionally, the semiconductor substrate 101 may include elementary semiconductor materials, compound semiconductor materials, and/or alloy semiconductor materials. Examples of elementary semiconductor materials may include, but are not limited to, crystal silicon, polycrystalline silicon, amorphous silicon, germanium, and/or diamond. Examples of compound semiconductor materials may include, but are not limited to, silicon carbide, gallium arsenic, gallium phosphide, indium phosphide, indium arsenide, and/or indium antimonide. Examples of alloy semiconductor materials may include, but are not limited to, SiGe, GaAsP, AlInAs, AlGaAs, GaInAs, GaInP, and/or GaInAsP.

In some embodiments, the semiconductor substrate 101 may include an epitaxial layer. For example, the semiconductor substrate 101 has an epitaxial layer overlying a bulk semiconductor. In some embodiments, the semiconductor substrate 101 may be a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

With reference to FIGS. 29 and 30, the source/drain region 103 may be formed in the semiconductor substrate 101. In some embodiments, the source/drain region 103 may be formed by an ion implantation process, and P-type dopants, such as boron (B), gallium (Ga), or indium (In), or N-type dopants, such as phosphorous (P) or arsenic (As), can be implanted in the semiconductor substrate 101 to form the source/drain region 103, depending on the conductivity type of the semiconductor device 1F.

With reference to FIGS. 29 and 30, the dielectric layer 105 may be formed over the source/drain region 103. In some embodiments, the dielectric layer 105 may include a bottom porous dielectric layer 1051 disposed over the source/drain region 103 and a top porous dielectric layer 1053 disposed over the bottom porous dielectric layer 1051. The capacitor contact 107 may be formed over the source/drain region 103 and may be surrounded by the dielectric layer 105. The capacitor contact 107 may include a liner layer 1071 and a conductive layer 1073, wherein the conductive layer 1073 includes a vertical portion 1073V and a horizontal portion 1073H. In some embodiments, a width W15 of the vertical portion 1073V is less than a width W14 of the horizontal portion 1073H. The bottom barrier layer 108 may be formed over the source/drain region 103 and disposed between the dielectric layer 105 and the capacitor contact 107. It should be noted that materials and formation methods of the dielectric layer 105 (including the bottom porous dielectric layer 1051 and the top porous dielectric layer 1053), the capacitor contact 107 (including the liner layer 1071 and the conductive layer 1073) and the bottom barrier layer 108 are the same as or similar to those of the bottom porous dielectric layer 411, the top porous dielectric layer 413, the non-mixing-area liner layer 201 and the non-mixing-area conductive layer 203 of the non-mixing-area conductive structure 200, and the bottom barrier layer 421 in FIG. 23, respectively, and thus descriptions of those features are not repeated herein.

With reference to FIGS. 29 and 30, the dielectric layer 111 may be formed over the capacitor contact 107. In some embodiments, the dielectric layer 111 may be disposed over a base layer 109 of the bottom capacitor electrode 159, which is described below. In some embodiments, the dielectric layer 111 may include dielectric materials such as silicon oxide, silicon nitride, silicon oxynitride, or other applicable dielectric materials. In some embodiments, the dielectric layer 111 may be formed by a deposition process such as a chemical vapor deposition (CVD) process, a physical vapor deposition (PVD) process, an atomic layer deposition (ALD) process, a spin-coating process, or another applicable process.

With reference to FIGS. 29 and 30, the patterned mask 141 may be formed over the dielectric layer 111. In some embodiments, the patterned mask 141 may entirely cover the dielectric layer 111. In some embodiments, the patterned mask 141 may be used as an etching mask in an etching process of the dielectric layer 111. A peripheral region (not shown) of the dielectric layer 111 may be exposed by the patterned mask 141. Sidewalls 111S of the dielectric layer 111 are substantially aligned with sidewalls 141S of the patterned mask 141. Within the context of this disclosure, the word "substantially" means preferably at least 90%, more preferably 95%, even more preferably 98%, and most preferably 99%.

With reference to FIGS. 29 and 30, the bottom capacitor electrode 159 may be formed over and electrically connected to the capacitor contact 107. The bottom capacitor electrode 159 may include the base layer 109 disposed between the capacitor contact 107 and the dielectric layer 111. The bottom capacitor electrode 159 may also include a surrounding portion 151 disposed over the base layer 109 and along the sidewalls 111S of the dielectric layer 111 and the sidewalls 141S of the patterned mask 141. The bottom capacitor electrode 159 further includes a first interconnect portion 153 disposed in the dielectric layer 111 and between the patterned mask 141 and the base layer 109, wherein the first interconnect portion 153 substantially parallel to the base layer 109. In some embodiments, the bottom capacitor electrode 159 further includes a second interconnect portion 155 disposed in the dielectric layer 111, between the first interconnect portion 153 and the base layer 109. The second interconnect portion 155 may be substantially parallel to the first interconnect portion 153.

In some embodiments, the base layer 109 may be made of a conductive material, such as aluminum (Al), copper (Cu), tungsten (W), titanium (Ti), tantalum (Ta), a combination thereof, or another applicable conductive material. Moreover, the base layer 109 may be formed by a deposition process, such as a CVD process, a PVD process, an ALD process, an MOCVD process, a sputtering process, a plating process, or another applicable process.

In some embodiments, the surrounding portion 151, the first interconnect portion 153 and the second interconnect portion 155 are made of a conductive material, such as aluminum (Al), copper (Cu), tungsten (W), titanium (Ti), tantalum (Ta), a combination thereof, or another applicable conductive material. The surrounding portion 151, the first interconnect portion 153 and the second interconnect portion 155 are formed by performing a deposition process and a subsequent planarizing process. The deposition process may include a CVD process, a PVD process, an ALD process, an MOCVD process, a sputtering process, a plating process, or another applicable process. The planarizing process may include a CMP process. In some embodiments, the surrounding portion 151 is formed along the sidewalls 111S of the dielectric layer 111 and along the sidewalls 141S of the patterned mask 141. After the planarizing process, a top surface of the surrounding portion 151 is substantially level (coplanar) with a top surface of the patterned mask 141.

In some embodiments, the base layer 109, the surrounding portion 151, the first interconnect portion 153 and the second interconnect portion 155 are physically and electrically connected. In some embodiments, the base layer 109 and the surrounding portion 151 collectively form a crown-shaped structure 157. In some embodiments, both of the first interconnect portion 153 and the second interconnect portion 155 are in direct contact with adjacent sidewalls 151S (i.e., the inner sidewalls) of the surrounding portion 151. In some embodiments, the base layer 109, the first interconnect portion 153 and the second interconnect portion 155 are separated from each other by the dielectric layer 111.

Still referring to FIGS. 28 to 30, in some embodiments, the first interconnect portion 153 substantially overlaps the second interconnect portion 155, and the first interconnect portion 153 and the second interconnect portion 155 form a grid pattern in a top view, as shown in FIG. 28. In some embodiments, the first interconnect portion 153, the second interconnect portion 155 and the base layer 109 are substantially parallel to each other. In some embodiments, the semiconductor device 1F is a dynamic random-access memory (DRAM) device.

One aspect of the present disclosure provides a semiconductor device including a first interconnect structure disposed in a semiconductor substrate; a first dielectric layer disposed over the semiconductor substrate; a second dielectric layer disposed over the first dielectric layer; a second interconnect structure disposed in the first dielectric layer and the second dielectric layer, and electrically connected to the first interconnect structure; and a third interconnect structure disposed in the semiconductor substrate. The first interconnect structure comprises a first conductive line and a first manganese-containing layer disposed over the first conductive line. The second interconnect structure comprises a second conductive line and a second manganese-containing layer disposed between the second conductive line and the first dielectric layer and between the second conductive line and the second dielectric layer. The third interconnect structure comprises a third conductive line and a third manganese-containing layer disposed over the third conductive line. The third manganese-containing layer of the third interconnect structure and the first manganese-containing layer of the first interconnect structure are made of a same material. The first interconnect structure and the second interconnect structure are disposed in a pattern-sparse region and the third interconnect structure is disposed in a pattern-dense region.

Another aspect of the present disclosure provides a semiconductor device including a capacitor contact disposed over a semiconductor substrate; a first dielectric layer disposed over the capacitor contact; a patterned mask disposed over the first dielectric layer; and a bottom capacitor electrode disposed over and electrically connected to the capacitor contact. The bottom capacitor electrode comprises a base layer disposed between the capacitor contact and the first dielectric layer; a surrounding portion disposed over the base layer and along sidewalls of the first dielectric layer and the patterned mask; and a first interconnect portion disposed between the patterned mask and the base layer. The first interconnect portion is substantially parallel to the base layer. The patterned mask is surrounded by the surrounding portion. Sidewalls of the patterned mask are substantially aligned with sidewalls of the first dielectric layer.

Another aspect of the present disclosure provides a semiconductor device including a first interconnect structure disposed in a semiconductor substrate; a second interconnect structure disposed over the first interconnect structure and electrically connected to the first interconnect structure, wherein the second interconnect structure comprises a first part disposed on the first interconnect structure and a second part disposed on the first part; a first dielectric layer disposed over the semiconductor substrate and surrounding the first part of the second interconnect structure; a top barrier layer disposed between the second part of the second interconnect structure and the first dielectric layer; and a second dielectric layer disposed above the first dielectric layer, covering the top barrier layer and surrounding the second part of the second interconnect structure.

Due to the design of the semiconductor device of the present disclosure, a parasitic capacitance of the semiconductor device 1A may be reduced by employing the bottom porous dielectric layer 411, the top porous dielectric layer 413, and the middle porous dielectric layer 415 having low dielectric constants. As a result, the performance of the semiconductor device 1A may be improved. In addition, the bottom barrier layer 421 or the top barrier layer 423 may prevent an outgassing issue of the porous layers (i.e., the bottom porous dielectric layer 411, the top porous dielectric layer 413, and the middle porous dielectric layer 415), thereby preventing damage to the conductive structures (i.e., the mixing-area conductive structure 300 and the non-mixing-area conductive structure 200) and improving reliability of the semiconductor device 1A. Furthermore, the bottom barrier layer 421 and the top barrier layer 423 may also serve as etch-stop layers during formation of the conductive structures, thereby preventing damage to the bottom energy-removable layer 401 and the top energy-removable layer 403 during the formation of the conductive structures.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present application, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:

a pattern-sparse region;

a pattern-dense region;

a semiconductor substrate formed at the pattern-sparse region and the pattern-dense region;

a first interconnect structure disposed in the semiconductor substrate, wherein the first interconnect structure comprises:

a first conductive line; and a first manganese-containing layer disposed over the first conductive line;

a first dielectric layer disposed over the semiconductor substrate;

a second dielectric layer disposed over the first dielectric layer;

a second interconnect structure disposed in the first dielectric layer and the second dielectric layer, and electrically connected to the first interconnect structure, wherein the second interconnect structure comprises:

a second conductive line; and a second manganese-containing layer disposed between the second conductive line and the first dielectric layer, and between the second conductive line and the second dielectric layer; and a third interconnect structure disposed in the semiconductor substrate, wherein the third interconnect structure comprises:

a third conductive line; and a third manganese-containing layer disposed over the third conductive line, wherein the third manganese-containing layer of the third interconnect structure and the first manganese-containing layer of the first interconnect structure are made of a same material;

wherein the first interconnect structure and the second interconnect structure are disposed in the pattern-sparse region and the third interconnect structure is disposed in the pattern-dense region;

wherein the first dielectric layer comprises a bottom porous dielectric layer disposed on the semiconductor substrate, a middle porous dielectric layer disposed on the bottom porous dielectric layer and a top porous dielectric layer disposed on the middle porous dielectric layer.

2. The semiconductor device of claim 1, wherein the first interconnect structure further comprises a first barrier layer disposed between the semiconductor substrate and the first conductive line, the second interconnect structure further comprises a second barrier layer disposed between the first and second dielectric layers and the second conductive line, and the third interconnect structure further comprises a third barrier layer disposed between the semiconductor substrate and the third conductive line.

3. The semiconductor device of claim 2, wherein the first barrier layer is formed to cover sidewalls of the first conductive line, sidewalls of the first manganese-containing layer and a bottom surface of the first conductive line, and the second barrier layer is conformally formed to cover sidewalls of the second manganese-containing layer.

4. The semiconductor device of claim 3, wherein the first conductive line and the first manganese-containing layer are separated from the semiconductor substrate by the first barrier layer, the second conductive line and the second manganese-containing layer are separated from the first dielectric layer and the second dielectric layer by the second barrier layer, and the third conductive line and the third manganese-containing layer are separated from the semiconductor substrate by the third barrier layer.

5. The semiconductor device of claim 4, wherein the second manganese-containing layer is sandwiched between the second barrier layer and the second conductive line.

6. The semiconductor device of claim 4, wherein the first conductive line, the second conductive line and the third conductive line are made of copper (Cu).

7. The semiconductor device of claim 4, wherein the first manganese-containing layer, the second manganese-containing layer and the third manganese-containing layer are made of manganese (Mn).

8. The semiconductor device of claim 4, wherein the first barrier layer, the second barrier layer and the third barrier layer are made at least one of tantalum (Ta), tantalum nitride (TaN), titanium (Ti), and titanium nitride (TiN).

9. The semiconductor device of claim 2, wherein the second interconnect structure comprises a bottom portion disposed over the first interconnect structure, and a top portion disposed on the bottom portion.

10. The semiconductor device of claim 9, wherein a width of the top portion of the second interconnect structure is greater than a width of the bottom portion of the second interconnect structure.

11. The semiconductor device of claim 10, wherein the second interconnect structure has a T-shaped cross-sectional profile.

12. The semiconductor device of claim 11, further comprising a top barrier layer disposed between the second barrier layer and the top porous dielectric layer, wherein the top barrier layer is surrounded by the second dielectric layer and is disposed over the pattern-sparse region of the semiconductor substrate.

13. The semiconductor device of claim 12, wherein a width of the top barrier layer is greater than the width of the bottom portion of the second interconnect structure.

14. The semiconductor device of claim 13, wherein the width of the top barrier layer is less than the width of the top portion of the second interconnect structure.

15. The semiconductor device of claim 14, wherein the top barrier layer is made of at least one of silicon nitride, silicon oxynitride, and silicon nitride oxide.

16. The semiconductor device of claim 2, wherein a porosity of the middle porous dielectric layer may gradually decrease at positions of decreasing distance from the semiconductor substrate.

17. The semiconductor device of claim 16, wherein the porosity of the middle porous dielectric layer is less than a porosity of the top porous dielectric layer and is greater than a porosity of the bottom porous dielectric layer.

* * * * *